US012457887B2

(12) United States Patent
Seong et al.

(10) Patent No.: US 12,457,887 B2
(45) Date of Patent: Oct. 28, 2025

(54) ORGANIC LIGHT EMITTING DIODE DISPLAY COMPRISING RANDOM NANO-PATTERNS AND MICRO LENSES

(71) Applicant: LG Display Co., Ltd., Seoul (KR)

(72) Inventors: Se-Jong Seong, Paju-si (KR); Se-Hong Park, Paju-si (KR); Seung-Kyeom Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 474 days.

(21) Appl. No.: 17/968,618

(22) Filed: Oct. 18, 2022

(65) Prior Publication Data

US 2023/0126988 A1    Apr. 27, 2023

(30) Foreign Application Priority Data

Oct. 25, 2021    (KR) .................. 10-2021-0142650

(51) Int. Cl.
*H10K 50/858*    (2023.01)
*H10K 50/84*    (2023.01)
(Continued)

(52) U.S. Cl.
CPC ........... *H10K 50/858* (2023.02); *H10K 50/84* (2023.02); *H10K 50/856* (2023.02); *H10K 59/12* (2023.02);
(Continued)

(58) Field of Classification Search
CPC .... H10K 50/858; H10K 59/879; H10K 50/84; H10K 50/844; H10K 50/856; H10K 59/878; H10K 59/38; H10K 59/124
See application file for complete search history.

(56) References Cited

U.S. PATENT DOCUMENTS

| 8,692,237 B2 | 4/2014 | Kim et al. |
| 9,620,570 B2 | 4/2017 | Koo et al. |

(Continued)

FOREIGN PATENT DOCUMENTS

| DE | 102018129856 A1 | 6/2019 |
| KR | 10-2010-0078354 A | 7/2010 |

(Continued)

OTHER PUBLICATIONS

Korean Intellectual Property Office, Office Action, Korean Patent Application No. 10-2021-0142650, Jan. 7, 2025, 12 pages.

(Continued)

*Primary Examiner* — Nduka E Ojeh
(74) *Attorney, Agent, or Firm* — Fenwick & West LLP

(57) ABSTRACT

An organic light emitting diode display includes: a substrate including a plurality of sub-pixels that each include an emission area and a non-emission area; a thin film transistor in the non-emission area; a passivation layer on the thin film transistor, the passivation layer including a surface that has random nano-patterns; a first overcoat layer on the passivation layer, the first overcoat layer including a surface having a plurality of micro lenses and the first overcoat layer having a first refractive index; a second overcoat layer on the first overcoat layer, the second overcoat layer including a flat surface and a second refractive index that is greater than the first refractive index of the first overcoat layer; and a light emitting diode on the second overcoat layer in the emission area.

23 Claims, 13 Drawing Sheets

(51) Int. Cl.
*H10K 50/856* (2023.01)
*H10K 59/12* (2023.01)
*H10K 59/38* (2023.01)
*H10K 102/00* (2023.01)

(52) U.S. Cl.
CPC ....... H10K 59/38 (2023.02); *H10K 2102/331* (2023.02)

(56) References Cited

U.S. PATENT DOCUMENTS

| | | | |
|---|---|---|---|
| 11,011,732 B2 | 5/2021 | Lee et al. | |
| 11,703,711 B2 | 7/2023 | Kim et al. | |
| 2005/0263775 A1* | 12/2005 | Ikeda | H10K 50/865 |
| | | | 257/79 |
| 2011/0266577 A1 | 11/2011 | Kim et al. | |
| 2015/0349291 A1* | 12/2015 | Song | H10K 59/35 |
| | | | 257/40 |
| 2015/0380466 A1* | 12/2015 | Koo | H10K 50/86 |
| | | | 438/70 |
| 2018/0190719 A1* | 7/2018 | Kim | H10K 50/858 |
| 2019/0067383 A1* | 2/2019 | Jo | H10K 59/38 |
| 2019/0103442 A1* | 4/2019 | Choi | H10K 50/82 |
| 2019/0131578 A1 | 5/2019 | Lee et al. | |
| 2019/0163016 A1 | 5/2019 | Kim et al. | |
| 2019/0341428 A1* | 11/2019 | Lee | H10K 50/125 |
| 2020/0403038 A1* | 12/2020 | Kim | H10K 50/8426 |
| 2021/0366993 A1* | 11/2021 | Chen | H10K 50/865 |
| 2022/0302216 A1* | 9/2022 | Hu | H10K 59/38 |

FOREIGN PATENT DOCUMENTS

| | | |
|---|---|---|
| KR | 10-2015-0086702 A | 7/2015 |
| KR | 10-2016-0001260 A | 1/2016 |
| KR | 10-2019-0048833 A | 5/2019 |
| KR | 10-2019-0080293 A | 7/2019 |

OTHER PUBLICATIONS

German Patent and Trade Mark Office, Office Action, German Patent Application No. 102022127714.3, Apr. 29, 2025, eight pages.

* cited by examiner

ORGANIC LIGHT EMITTING DIODE DISPLAY COMPRISING RANDOM NANO-PATTERNS AND MICRO LENSES

CROSS REFERENCE TO RELATED APPLICATION

The present application claims the priority benefit of Republic of Korea Patent Application No. 10-2021-0142650 filed in Republic of Korea on Oct. 25, 2021, which is hereby incorporated by reference in its entirety.

BACKGROUND

Field of Technology

The present disclosure relates to a light emitting diode display, and particularly, relates to a light emitting diode display which improves a light extraction efficiency.

Discussion of the Related Art

Recently, as society enters a full-fledged information age, interest in information displays that process and display a large amount of information has been increased, and as a demand for using portable information media has been increased, various lightweight and thin flat displays have been developed and been in the spotlight.

Among various flat displays, in an organic light emitting diode display, a significant portion of light emitted from an organic light emitting layer is lost in the process of passing through various components of the organic light emitting diode display and being emitted to outside the display. The light emitted to the outside of the organic light emitting diode display accounts for about 20% of the light produced in the organic light emitting layer.

Since an amount of light emitted from the organic light emitting layer is increased along with an amount of current applied to the organic light emitting diode display, it is possible to increase a luminance of the organic light emitting diode display by applying more current to the organic light emitting diode display. However, this increases power consumption and also reduces a lifetime of the organic light emitting diode display.

SUMMARY

In order to improve a light extraction efficiency of the organic light emitting diode display, a method of attaching a micro lens array (MLA) to an outside of a substrate of the organic light emitting diode display or forming a micro lens at an overcoat layer of the organic light emitting diode display is disclosed.

Accordingly, the present disclosure is directed to a light emitting diode display that substantially obviates one or more of the problems due to limitations and disadvantages of the related art.

An advantage of the present disclosure is to provide a light emitting diode display which can extract light trapped inside an element to an outside even when introducing a micro lens array to an outside of a substrate or forming a micro lens inside the display, and thus can improve a light extraction efficiency and increase a lifetime.

Another advantage of the present invention is to provide a light emitting diode display which can prevent or at least reduce an occurrence of a rainbow mura (or rainbow stain) that may reduce visibility and cause eye fatigue.

Another advantage of the present disclosure is to provide a light emitting diode display which can improve a contrast ratio by preventing a decrease in a visibility of a black color due to a high reflectance.

Another advantage of the present invention is to provide a light emitting diode display which can realize an image of an excellent color sensitivity.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display includes: a substrate including a plurality of sub-pixels, each of the plurality of sub-pixels including an emission area that emits light and a non-emission area; a thin film transistor in the non-emission area of a sub-pixel; a passivation layer on the thin film transistor, the passivation layer including a surface that has random nano-patterns; a first overcoat layer on the passivation layer, the first overcoat layer including a surface having a plurality of micro lenses and the first overcoat layer having a first refractive index; a second overcoat layer on the first overcoat layer, the second overcoat layer including a flat surface and a second refractive index that is greater than the first refractive index of the first overcoat layer; and a light emitting diode on the second overcoat layer in the emission area of the sub-pixel.

In one embodiment, an organic light emitting diode display comprises: a substrate including a subpixel, the subpixel including an emission area that emits light and a non-emission area; a thin film transistor in the non-emission area; a passivation layer on the thin film transistor, a portion of a surface of the passivation layer that overlaps the emission area including a plurality of first protrusions where a first protrusion from the plurality of first protrusions has a first size; an overcoat layer on the passivation layer, a surface of the overcoat layer including a plurality of second protrusions where a second protrusion from the plurality of second protrusions has a second size that is larger than the first size; and a light emitting diode on the overcoat layer in the emission area, the light emitting diode connected to the transistor.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Hereinafter, an embodiment according to the present invention is explained with reference to the drawings.

Figure 1:
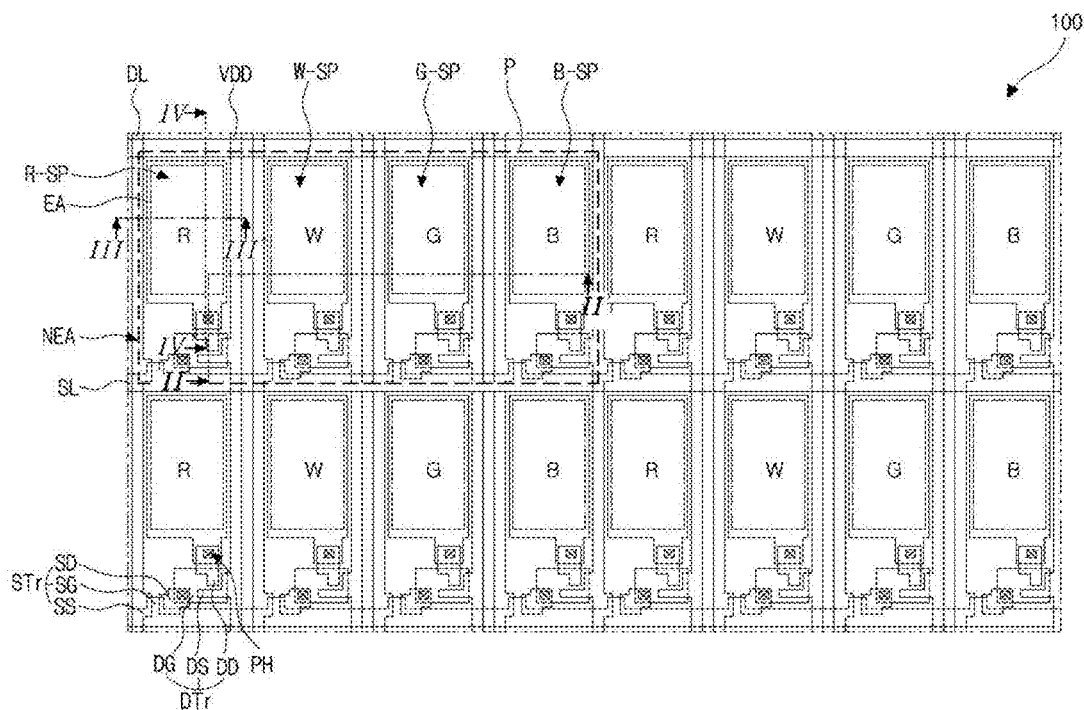
FIG. 1 is a plan view illustrating a structure of a unit pixel including four sub-pixels in an organic light emitting diode display according to an embodiment of the present disclosure.

FIG. 1 is a plan view illustrating a structure of a unit pixel including four sub-pixels in an organic light emitting diode display according to an embodiment of the present disclosure.

Figure 2:
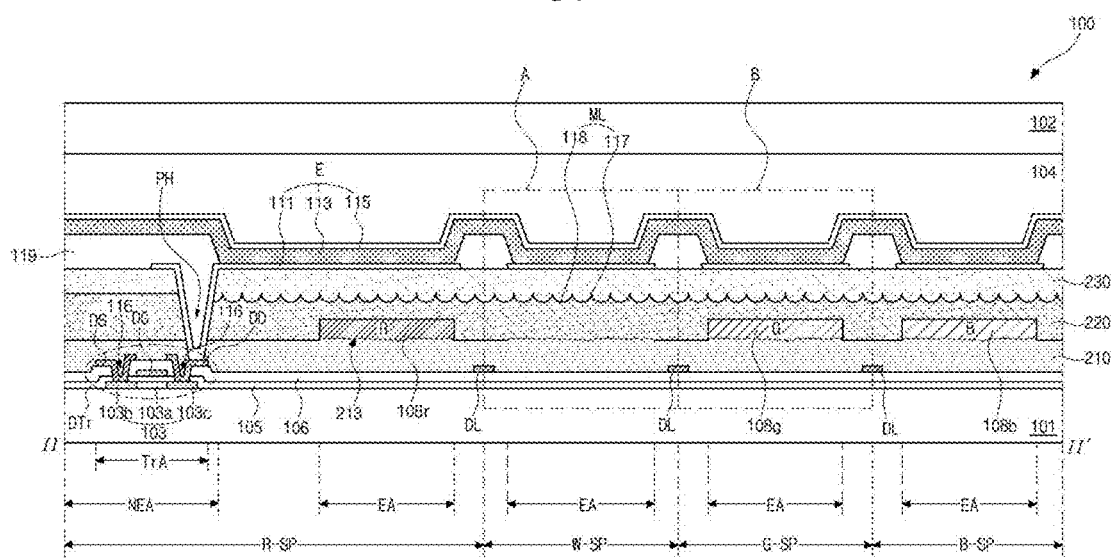
FIG. 2 is a cross-sectional view, taken along a line II-II' in FIG. 1, illustrating a structure of a unit pixel including four sub-pixels of an organic light emitting diode display according to an embodiment of the present disclosure.

FIG. 2 is a cross-sectional view, taken along a line II-II' in FIG. 1, illustrating a structure of a unit pixel including four sub-pixels of an organic light emitting diode display according to an embodiment of the present disclosure.

Figure 3:
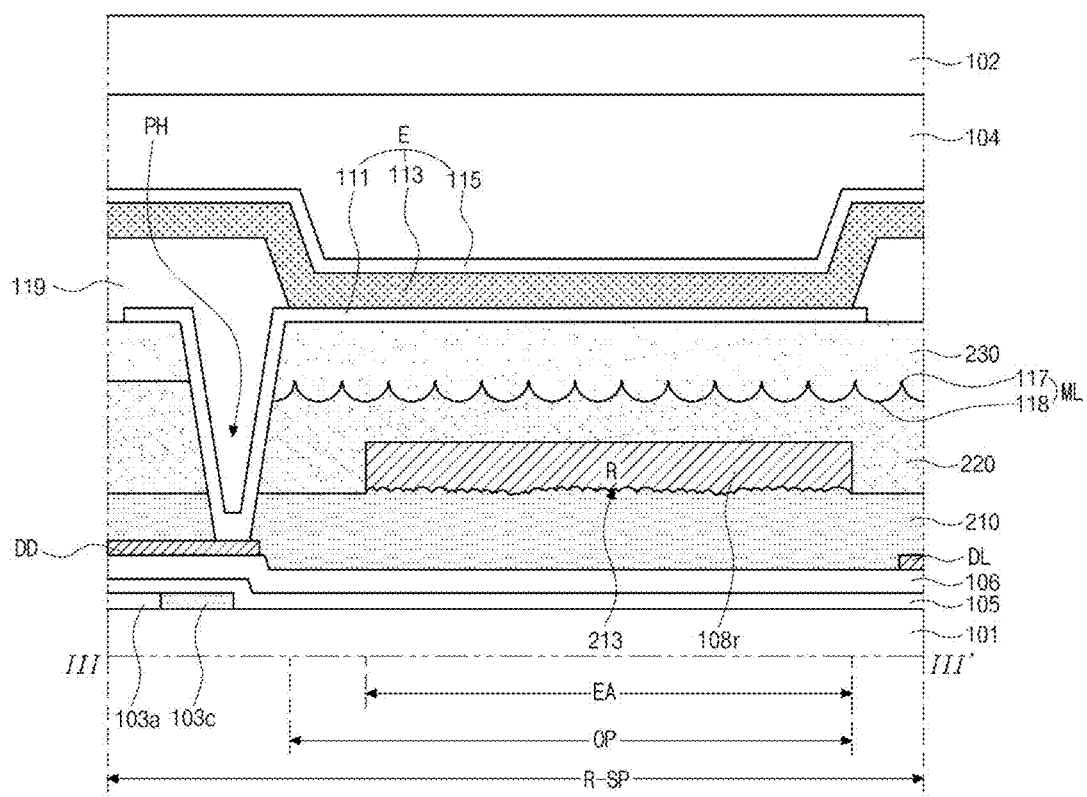
FIGS. 3 and 4 are enlarged cross-sectional views, taken along lines III-III' and IV-IV' in FIG. 1, respectively, illustrating a structure of one sub-pixel according to the present disclosure.
Figure 4:
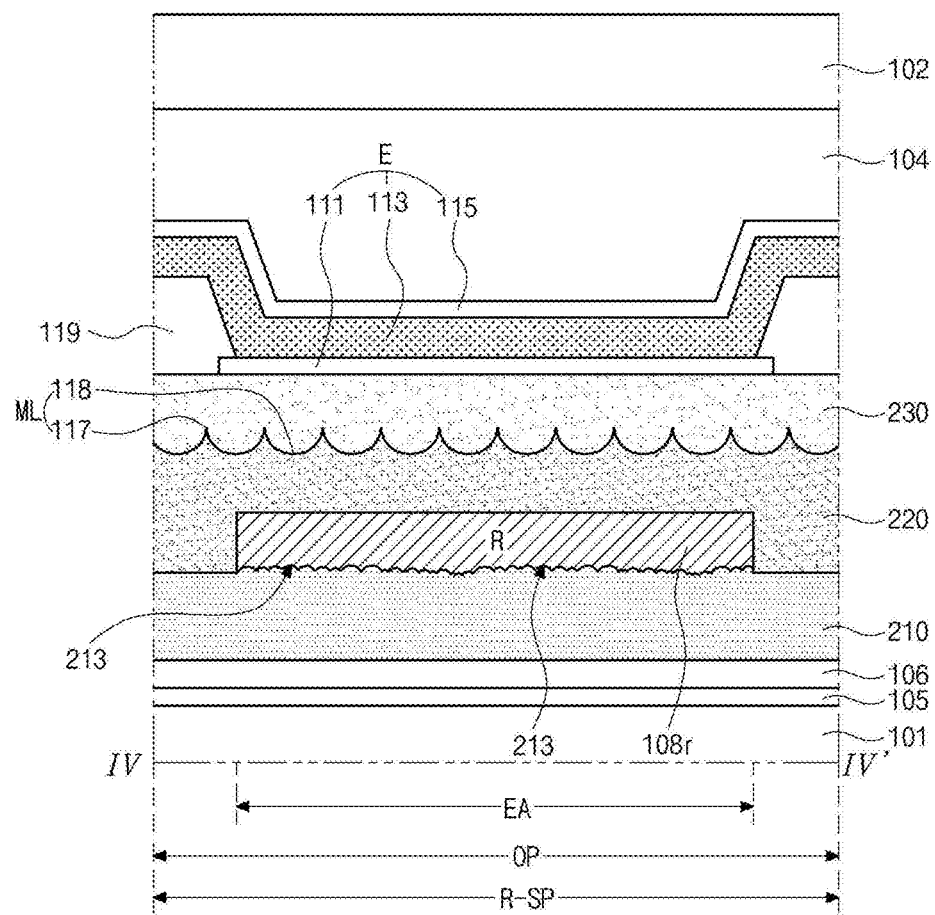
Figure 5A:
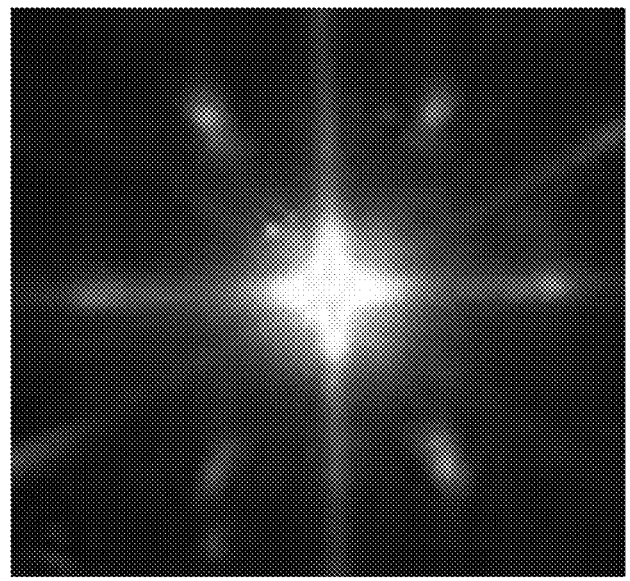
FIG. 5A is a photograph of a rainbow mura of a conventional organic light emitting diode display.
Figure 5B:
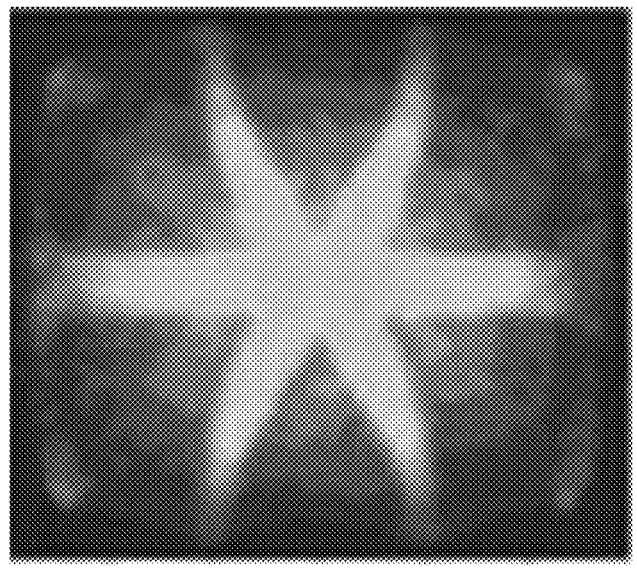
FIGS. 5B and 5C are results of simulating reflectivity due to a rainbow mura.
Figure 5C:
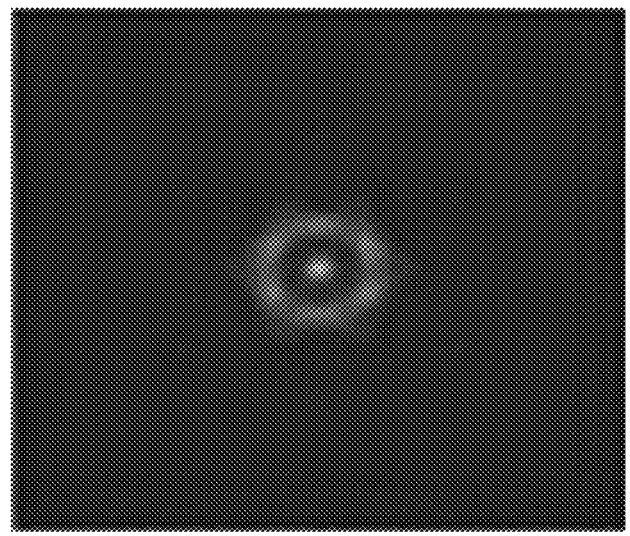

FIGS. 3 and 4 are enlarged cross-sectional views, taken along lines III-III' and IV-IV' in FIG. 1, respectively, illustrating a structure of one sub-pixel according to the present disclosure. FIG. 5A is a photograph of a rainbow mura of a conventional organic light emitting diode display, and FIGS. 5B and 5C are results of simulating reflectivity due to a rainbow mura.

The organic light emitting diode display 100 according to the embodiment of the present disclosure is categorized into a top emission type and a bottom emission type according to a transmission direction of an emitted light. Hereinafter, in the present disclosure, the bottom emission type is described as an example.

As shown in FIG. 1, in the organic light emitting diode display 100 according to the embodiment of the present invention, one unit pixel P may include red, white, green and blue sub-pixels R-SP, W-SP, G-SP, B-SP, each of the sub-pixels R-SP, W-SP, G-SP and B-SP may include an emission area EA, and a bank 119 may be disposed along an edge of each emission area EA to form a non-emission area NEA.

Here, for convenience of explanations, the sub-pixels R-SP, W-SP, G-SP and B-SP are illustrated as being positioned side by side with the same width, but the sub-pixels R-SP, W-SP, G-SP and B-SP may have various structures with different widths.

At this time, a switching thin film transistor STr and a driving thin film transistor DTr may be disposed on the non-emission area NEA of each of the sub-pixels R-SP, W-SP, G-SP and B-SP, and a light emitting diode E including an anode 111, an organic light emitting layer 113 and a cathode 115 may be disposed on the light emitting area EA in each of the sub-pixels SP, W-SP, G-SP and B-SP.

Here, the switching thin film transistor STr and the driving thin film transistor DTr may be connected to each other, and the driving thin film transistor DTr may be connected to the light emitting diode E.

In more detail, a plurality of sub-pixels R-SP, W-SP, G-SP and B-SP may be defined on the substrate 101, and each of the sub-pixels R-SP, W-SP, G-SP and B-SP may be defined by an intersecting structure of gate lines SL, data lines DL and power lines VDD, but is not limited thereto.

The switching thin film transistor STr may be formed at the intersection of the gate line SL and the data line DL, and the switching thin film transistor STr may serve to select its respective sub-pixel R-SP, W-SP, G-SP or B-SP.

The switching thin film transistor STr may include a gate electrode SG branching from the gate line SL, a semiconductor layer (not shown), a source electrode SS, and a drain electrode SD.

The driving thin film transistor DTr may serve to drive the light emitting diode E of the sub-pixel R-SP, W-SP, G-SP or B-SP selected by the switching thin film transistor STr. The driving thin film transistor DTr may include a gate electrode DG connected to the drain electrode SD of the switching thin film transistor STr, a semiconductor layer 103, a source electrode DS connected to the power line VDD, and a drain electrode DD.

The drain electrode DD of the driving thin film transistor DTr may be connected to the anode 111 of the light emitting diode E through a drain contact hole PH, and the organic light emitting layer 113 may be interposed between the anode 111 and the cathode 115.

In more detail, referring to FIGS. 2 and 3, the semiconductor layer 103 may be located on a switching area TrA of each of the sub-pixels R-SP, W-SP, G-SP and B-SP on the substrate 101. The semiconductor layer 103 may be made of silicon, and may include an active region 103a forming a channel at a center portion thereof, and source and drain areas 103b and 103c doped with high concentrations of impurities at both sides of the active region 103a.

A gate insulating layer 105 may be positioned on the semiconductor layer 103.

The gate electrode DG corresponding to the active region 103a of the semiconductor layer 103 and the gate line SL extending in one direction may be located on the gate insulating layer 105.

In addition, an inter-layered insulating layer 106 may be positioned on the gate electrode DG and the gate line SL. In this case, the inter-layered insulating layer 106 and the gate insulating layer 105 there below may include first and second semiconductor layer contact holes 116 respectively exposing the source and drain areas 103b and 103c located at both sides of the active area 103a.

Next, the source and drain electrodes DS and DD spaced apart from each other may be located on the inter-layered insulating layer 106 including the first and second semiconductor layer contact holes 116, and may respectively contact the source and drain areas 103b and 103c which are exposed through the first and second semiconductor layer contact holes 116.

A passivation layer 210 may be located on the source and drain electrodes DS and DD and on the inter-layered insulating layer 106 exposed between the source and drain electrodes DS and DD. A drain contact hole PH exposes the drain electrode DD of the driving thin film transistor DTr.

At this time, the source and drain electrodes DS and DD, the semiconductor layer 103 including the source and drain areas 103b and 103c in contact with the source and drain electrodes DS and DD, and the gate insulating layer 105 and the gate electrode DG located on the semiconductor layer 103 may form a driving thin film transistor DTr.

Meanwhile, although not shown in the drawings, the switching thin film transistor STr may have the same structure as the driving thin film transistor DTr and be connected to the driving thin film transistor DTr.

In addition, as for the switching thin film transistor (STr) and the driving thin film transistor (DTr), a top gate type in which the semiconductor layer 103 is formed of a polysilicon semiconductor layer or an oxide semiconductor layer is shown in the drawings as an example, and as a modification thereof, a bottom gate type formed of pure and impurity amorphous silicon may be used.

In this case, the substrate 101 is mainly made of a glass material, but may also be made of a transparent plastic material that can be bent or curved, for example, a polyimide material. When a plastic material is used for the substrate 101, a polyimide having an excellent heat resistance that can withstand high temperatures may be used in consideration of a high-temperature deposition process being performed over the substrate 101. The entire front surface of the substrate 101 may be covered by one or more buffer layers (not shown).

Meanwhile, the driving thin film transistor DTr in the switching area TrA may have a characteristic in which a threshold voltage is shifted by light. In order to prevent the threshold voltage shift, the organic light emitting diode display 100 according to the embodiment of the present disclosure may further include a light blocking layer (not shown) below the semiconductor layer 103.

The light blocking layer (not shown) may be provided between the substrate 101 and the semiconductor layer 103 to block a light incident toward the semiconductor layer 103 through the substrate 101. Thus a change of the threshold voltage of the driving thin film transistor DTr by an external light may be reduced or prevented. Such the light blocking layer (not shown) may be covered by a buffer layer (not shown).

Here, the passivation layer 210 according to the embodiment of the present disclosure may be characterized in that random nano-patterns 213 may be formed at the surface of the passivation layer 210 (e.g., a top surface) to correspond to the emission area EA. That is, each random nano-pattern 213 overlaps its respective emission area EA.

In one embodiment, the random nano-patterns 213 are protrusions from a surface of the passivation layer 210. Each protrusions of the random nano-patterns 213 may have a fine concave-convex shape and may each be different in size and form and have an irregular arrangement. The random nano-pattern 213 may be formed to have a size and a pitch of at least a wavelength band of visible light or less in one embodiment.

In addition, wavelength conversion layers 108r, 108g and 108b may be positioned on the passivation layer 210 corresponding to the emission areas EA of the respective sub-pixels R-SP, G-SP and B-SP. That is, each wavelength conversion layers 108r, 108g and 108b overlaps its respective emission area EA.

The wavelength conversion layers 108r, 108g and 108b may include color filters transmitting only wavelengths of color lights set in the red, green and blue sub-pixels R-SP, G-SP and B-SP among white lights emitted from the light emitting diodes E toward the substrate 101.

Here, the wavelength conversion layers 108r, 108g and 108b may transmit only red, green and blue wavelengths. The wavelength conversion layer 108r provided in the red sub-pixel R-SP may include a red color filter, the wavelength conversion layer 108g provided in the green sub-pixel G-SP may include a green color filter, and the wavelength conversion layer 108b provided in the blue sub-pixel B-SP may include a blue color filter.

In addition, in the white sub-pixel W-SP, a separate wavelength conversion layer may not be located, and a white light emitted from its light emitting diode E may be transmitted as it is.

In this case, the wavelength conversion layers 108r, 108g and 108b positioned in the red, green, and blue sub-pixels R-SP, G-SP and B-SP may respectively include quantum dots which have a size to emit the color lights set in the red, green and blue sub-pixels R-SP, G-SP and B-SP by re-emitting according to white light emitted from the light emitting diodes E toward the substrate 101. For example, the wavelength conversion layer 108r of the red sub-pixel R-SP may include a quantum dot of CdSe or InP, the wavelength conversion layer 108g of the green sub-pixel G-SP may include a quantum dot of CdZnSeS, and the wavelength conversion layer 108b of the blue sub-pixel B-SP may include a quantum dot of ZnSe. As such, the organic light emitting diode display 100 in which the wavelength conversion layers 108r, 108g and 108b include the quantum dots can have a high color reproducibility.

The wavelength conversion layers 108r, 108g and 108b according to another example may be formed of color filters containing quantum dots.

The first overcoat layer 220 may be positioned on the passivation layer 210 and the wavelength conversion layers 108r, 108g, and 108b. The first overcoat layer 220 may have a surface (e.g., a bottom surface) in which a plurality of concave portions 118 and a plurality of convex portions 117 are alternately arranged to form micro lenses ML. Each concave portion 118 may be considered a protrusion. Thus, the micro lens ML may include a plurality of protrusions.

Here, the convex portions 117 may have a structure that defines or surrounds each concave portion 118. The convex portion 117 may include a bottom portion (117a of FIG. 9), a top portion (117b of FIG. 9) and a side surface portion (117c of FIG. 9).

Figure 9:
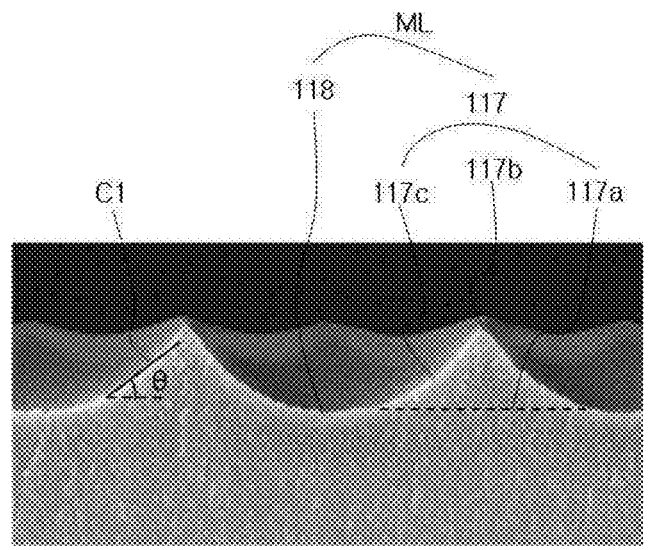
FIG. 9 is an enlarged photograph of a micro lens.

Here, the side surface portion (117c of FIG. 9) may be an area including a maximum slope (Smax) of the convex portion 117, and may be an entire inclined surface forming the top portion (117b of FIG. 9).

A path of a light emitted from the organic light emitting layer 113 is changed toward the substrate 101 through the convex portion 117, so that the organic light emitting diode display 100 according to the embodiment of the present disclosure can improve a light extraction efficiency.

A second overcoat layer 230 may be positioned on the first overcoat layer 220 including the micro lenses ML and may include the drain contact hole PH exposing the drain electrode DD along with the first overcoat layer 220 and the passivation layer 210 there below. The second overcoat layer 230 may cover the micro lenses ML of the first overcoat layer 220 to have a flat surface.

The second overcoat layer 230 and the first overcoat layer 220 may have different refractive indices. In one embodiment, the refractive index of the second overcoat layer 230 is greater than that of the first overcoat layer 220.

The anode 111 of the light emitting diode E made of, for example, a material having a relatively high work function value may be disposed on the second overcoat layer 230 with the flat surface and be connected to the drain electrode DD of the driving thin film transistor DTr.

The anode 111 may be positioned for each of the sub-pixels R-SP, W-SP, G-SP and B-SP, and the bank 119 may be positioned between the anodes 111 positioned in the respective sub-pixels R-SP, W-SP, G-SP and B-SP. In other words, by using the bank 119 as a boundary for each of the sub-pixels R-SP, W-SP, G-SP and B-SP, the anode 111 may have a structure separated for each of the sub-pixels R-SP, W-SP, G-SP and B-SP.

The organic light emitting layer 113 may be positioned on the anode 111. The organic light emitting layer 113 may be formed of a single layer made of an emitting material. Alternatively, in order to increase an emission efficiency, the organic light emitting layer 113 may be formed of multiple layers of a hole injection layer, a hole transport layer, an emitting material layer, an electron transport layer and an electron injection layer.

Here, both the anode 111 and the organic light emitting layer 113 sequentially positioned over the second overcoat layer 230 may be formed to be flat along the flat surface of the second overcoat layer 230.

Accordingly, as the organic light emitting layer 113 is formed to have a uniform thickness for each of the sub-pixels R-SP, W-SP, G-SP and B-SP, an emission characteristic can be also uniform for each of the sub-pixels R-SP, W-SP, G-SP and B-SP, and through this, an efficiency of the organic light emitting layer 113 for each area within each of the sub-pixels R-SP, W-SP, G-SP and B-SP can be increased and a lifetime can also be improved.

In addition, the cathode 115 may be positioned entirely on the organic light emitting layer 113.

The cathode 115 may be also formed to be flat along the flat surface of the second overcoat layer 230.

Accordingly, in the organic light emitting diode display 100 according to the embodiment of the present disclosure, when predetermined voltages are applied to the anode 111 and the cathode 115 according to a selected signal, holes injected from the anode 111 and electrons provided from the cathode 115 are transported to the organic light emitting layer 113 to form excitons. When the excitons are transitioned from an excited state to a ground state, light is generated and emitted in a form of visible light.

Here, since the emitted light passes through the transparent anode 111 and goes out, the organic light emitting diode display 100 realizes an arbitrary image.

After placing a protective film 102 in a form of a thin film over the driving thin film transistor DTr and the light emitting diode E, the protective film 102 and the substrate 101 are bonded to each other by interposing a face seal 104, which is made of an organic or inorganic insulating material that is transparent and has an adhesive property, between the light emitting diode E and the protective film 102, so that the organic light emitting diode display 100 is encapsulated.

Here, the protective film 102 is used by laminating at least two inorganic protective films in order to prevent or at least reduce external oxygen and moisture from penetrating into the organic light emitting diode display 100. In one embodiment, an organic protective film is interposed between the two inorganic protective films in order to supplement an impact resistance of the inorganic protective films.

In such the structure in which such the organic protective film and the inorganic protective film are alternately and repeatedly laminated, the inorganic protective film completely encloses the organic protective film because it is necessary to prevent moisture and oxygen from penetrating through a side surface of the organic protective film.

Accordingly, the organic light emitting diode display 100 can prevent or at least reduce moisture and oxygen from penetrating into the organic light emitting diode display 100 from the outside.

Here, in the organic light emitting diode display 100 according to the embodiment of the present disclosure, a luminance viewing angle is improved by providing the random nano-pattern 213 at the surface of the passivation layer 210.

In addition, in the organic light emitting diode display 100 according to the embodiment of the present disclosure, the first and second overcoat layers 220 and 230 having different refractive indices may be stacked on each other, the first overcoat layer 220 may include micro lenses ML, and the second overcoat layer 230 may cover the micro lenses ML to be planarized, thereby improving an outward light extraction efficiency and preventing an occurrence of a rainbow mura.

Here, the rainbow mura may be generated through a reflection visibility due to an interference of visible light as a light emitted from each organic light emitting layer 113 is refracted through a curved surface and a path of the light is changed. In the organic light emitting diode display 100 according to the present disclosure, as the organic light emitting layer 113 is positioned on the second overcoat layer 230 having the flat surface, the rainbow mura does not occur.

FIG. 5A is a photograph of a rainbow mura of a conventional organic light emitting diode display, and FIG. 5B is a result of simulating a reflectivity due to the photograph of FIG. 5A.

As shown in FIG. 5B, it is seen that the reflection visibility is high due to the rainbow mura, and a measured reflectance is very high at about 34.49%.

On the other hand, FIG. 5C is a result of simulating a reflectivity of the organic light emitting diode display 100 according to the embodiment of the present disclosure. As shown in FIG. 5C, the reflection visibility is lower than that in FIG. 5B.

The measured reflectance of the organic light emitting diode display 100 according to the embodiment of the present invention of FIG. 5C is 8.15%, which is reduced by about 26% or more compared to the reflectance of FIG. 5B. Thus, the organic light emitting diode display 100 according to the embodiment of the present invention, a rainbow mura does not occur or is at least reduced.

In addition, since the organic light emitting layer 113 having a uniform thickness can be formed for each of the sub-pixels R-SP, W-SP, G-SP and B-SP, each of the sub-pixels R-SP, W-SP, G-SP and B-SP can have a uniform emission characteristic, thereby improving an efficiency of the organic light emitting layer 113 and also increasing a lifetime.

In addition, by reducing the reflection visibility in the above way, it is possible to prevent a high reflectance from occurring. As a result, it is prevented that a visibility of a black color is deteriorated, and thus a contrast ratio is improved.

Here, a collective size of the random nano-pattern 213 may be smaller than that of the collective size of micro lens ML, and may be formed more finely than a micrometer (um). Furthermore, each protrusion included in the random nano-pattern 213 has a size that is also smaller than a size of each lens included in the micro lens ML.

In other words, when the micro lens ML has a size of several micrometers, the size of the random nano-pattern 213 may be several nanometers. Thus, the size of each lens included in the micro lens ML is greater than a size of each protrusion included in the random nano-pattern 213. Accordingly, a light emitted from the organic light emitting layer 113 is scattered without loss by the random nano-pattern 213, thereby improving a luminance viewing angle. This is described in detail later.

In the organic light emitting diode display 100 according to the embodiment of the present disclosure, the random nano-patterns 213 formed at the surface of the passivation layer 210 may be formed in the emission area EA of each of the sub-pixels R-SP, W-SP, G-SP and B-SP but not the non-emission area. When the random nano-patterns 213 are not formed to correspond to the emission area EA of each of the sub-pixels R-SP, W-SP, G-SP and B-SP, a light (L of FIG. 6A) refracted and scattered by the random nano-pattern 213 may be incident on neighboring sub-pixels R-SP, W-SP, G-SP and B-SP, so that a color mixing may occur in adjacent sub-pixels R-SP, W-SP, G-SP and B-SP. This reduces a color reproducibility of the organic light emitting diode display 100.

In addition, by forming the micro lenses ML at the surface of the first overcoat layer 220 to be wider than the emission area EA, among the light (L of FIG. 6A) emitted from the organic light emitting layer 113, a light emitted laterally or a light L extinguished in the non-emission area NEA by repeated total reflections between the first and second overcoat layers 220 and 230 is changed in a travelling path, and an extraction efficiency of the light (L of FIG. 6A) is further improved.

In other words, the micro lens ML is used in both of the emission area EA and the non-emission area NEA so that an extraction efficiency of the light (L of FIG. 6A) can be maximized.

Figure 6A:
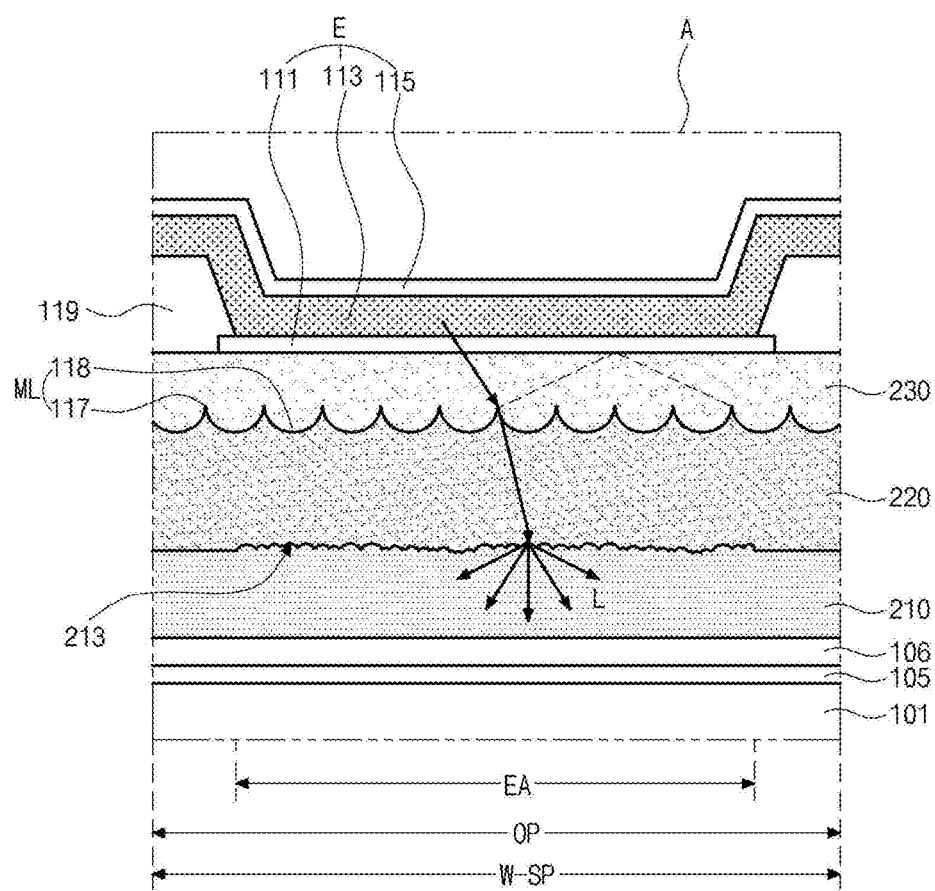
FIG. 6A is an enlarged view of a portion A shown in FIG. 2 for illustrating a light travelling path of a white sub-pixel according to an embodiment of the present disclosure.
Figure 6B:
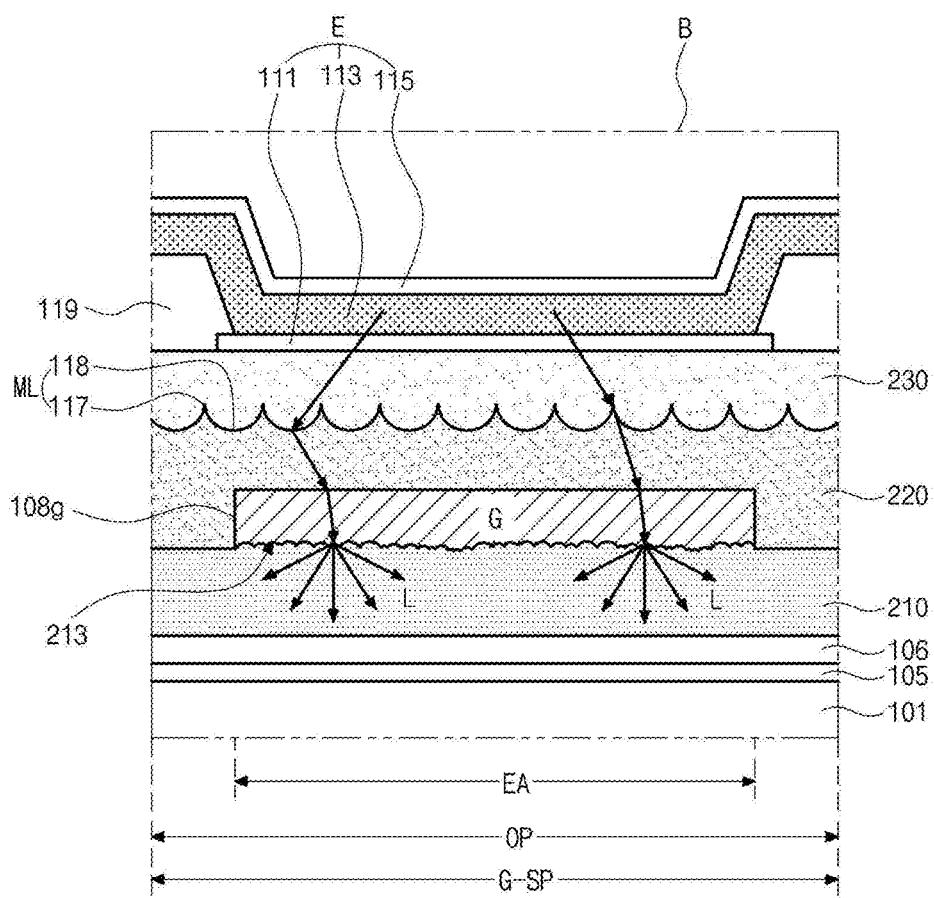
FIG. 6B is an enlarged view of a portion B shown in FIG. 2 for illustrating a light travelling path of a green sub-pixel pixel according to an embodiment of the present disclosure.

FIG. 6A is an enlarged view of a portion A shown in FIG. 2 for illustrating a light travelling path of a white sub-pixel. FIG. 6B is an enlarged view of a portion B shown in FIG. 2 for illustrating a light travelling path of a green sub-pixel.

Figure 7A:
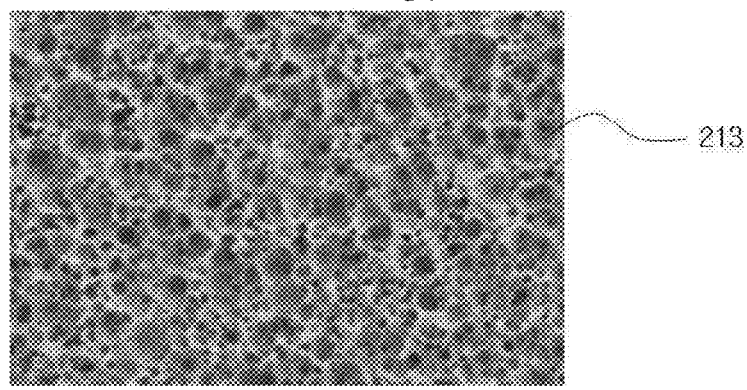
FIGS. 7A and 7B are enlarged photographs of arrangement of random nano-patterns.
Figure 7B:

FIGS. 7A and 7B are enlarged photographs of arrangement of random nano-patterns. FIGS. 8A to 8D are graphs measuring luminance viewing angles according to presence or absence of random nano-patterns in a passivation layer.

Figure 10:
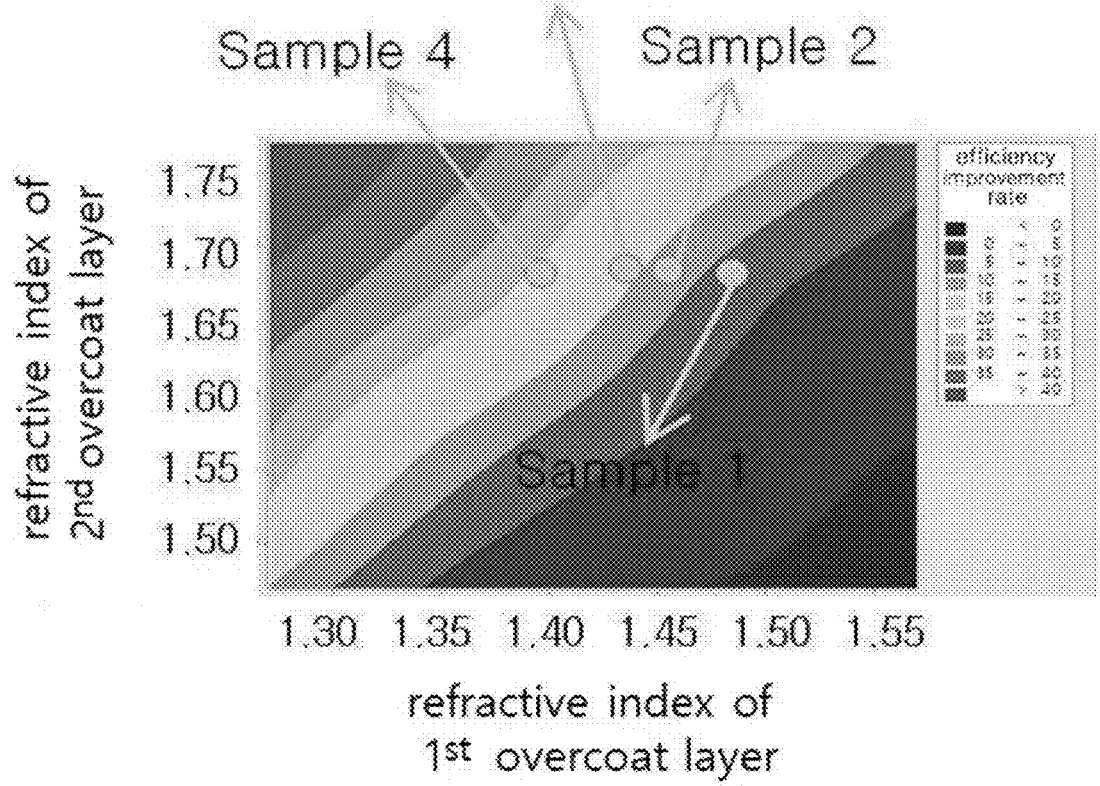
FIG. 10 is a simulation result of measuring an efficiency improvement rate due to a difference in refractive index between first and second overcoat layers.

FIG. 9 is an enlarged photograph of a micro lens, and FIG. 10 is a simulation result of measuring an efficiency improvement rate due to a difference in refractive index between first and second overcoat layers.

As shown in FIGS. 6A and 6B, the random nano-patterns 213 may be formed at the surface of the passivation layer 210, and the random nano-patterns 213 may be formed corresponding (e.g., overlapping) to the emission area EA of each of the sub-pixels R-SP, W-SP, G-SP and B-SP.

The random nano-patterns 213 may have a fine concave-convex shape, and as shown in FIGS. 7A and 7B, the random nano-patterns 213 may be different in size and shape and the arrangement thereof may be irregular.

The random nano-pattern 213 may be formed to have a size of several nanometers, and may be formed to have a size and a pitch of at least a wavelength band of visible light or less. In other words, each of the random nano-patterns 213 may have a size that is 1/10 of a visible light wavelength or a size of a visible light wavelength band, so that a light emitted from the organic light emitting layer 113 may be scattered without loss.

Here, when the size of the random nano-pattern 213 is less than 1/10 of the visible light wavelength band, a transmittance of light is increased so that a scattering does not occur effectively. When the size of the random nano-pattern 213 is greater than the visible light wavelength band, a directivity of a light passing through the random nano-pattern 213 is generated, and the random nano-pattern 213 can be visually recognized.

In one embodiment, the random nano-patterns 213 are arranged irregularly. If the random nano-patterns 213 have a certain regularity, different colors may be displayed at different viewing angles due to a diffraction grating effect. Therefore, the random nano-patterns 213 are irregularly disposed in one embodiment.

In other words, the random nano-patterns 213 may be different in each of diameter and height from each other. More specifically, as for three adjacent random nano-patterns 213, at least one of these nano-patterns needs to have a different shape (i.e., diameter or height) to reduce a diffraction grating effect generated by repeated patterns.

The random nano-patterns 213 may refract and scatter a light, which may be extinguished due to a total reflection among a light emitted from the organic light emitting layer 113, in a direction in which it is output, thereby improving a luminance viewing angle.

Figure 8A:
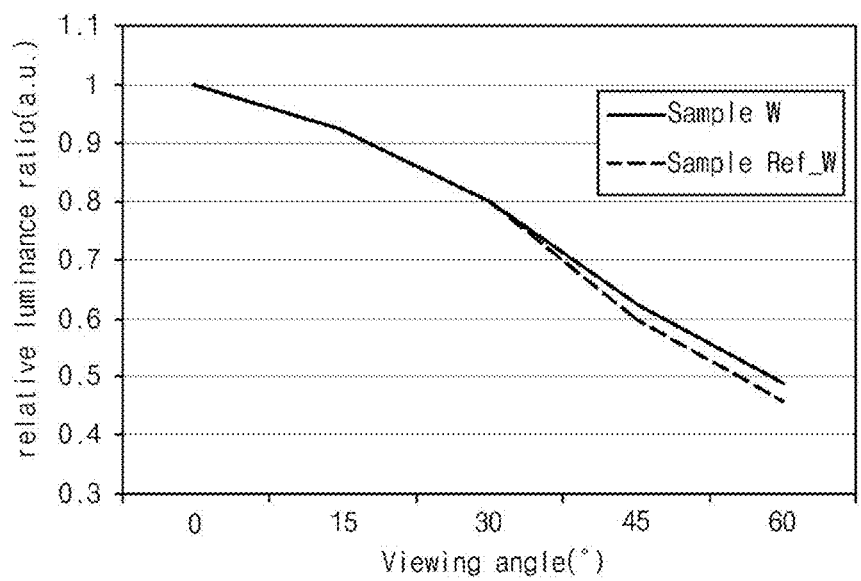
FIGS. 8A to 8D are graphs measuring luminance viewing angles according to presence or absence of random nano-patterns in a passivation layer.
Figure 8B:
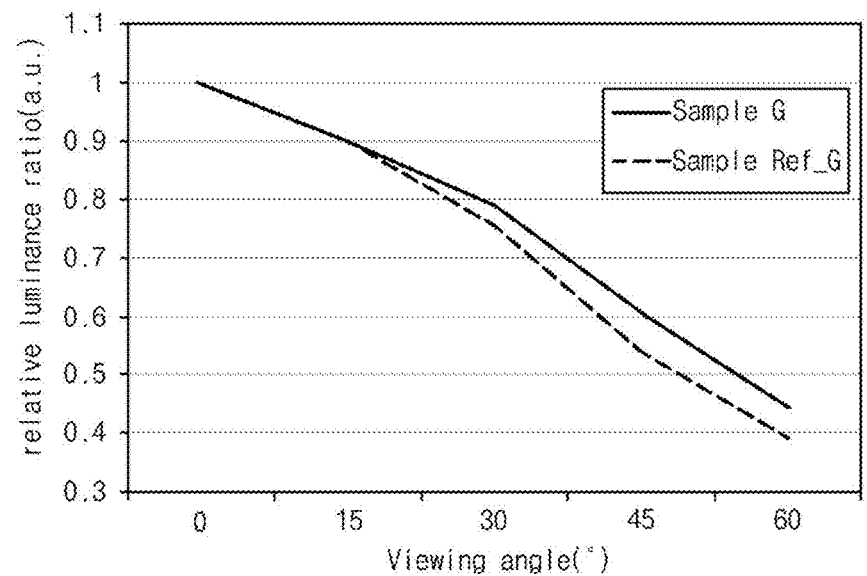
Figure 8C:
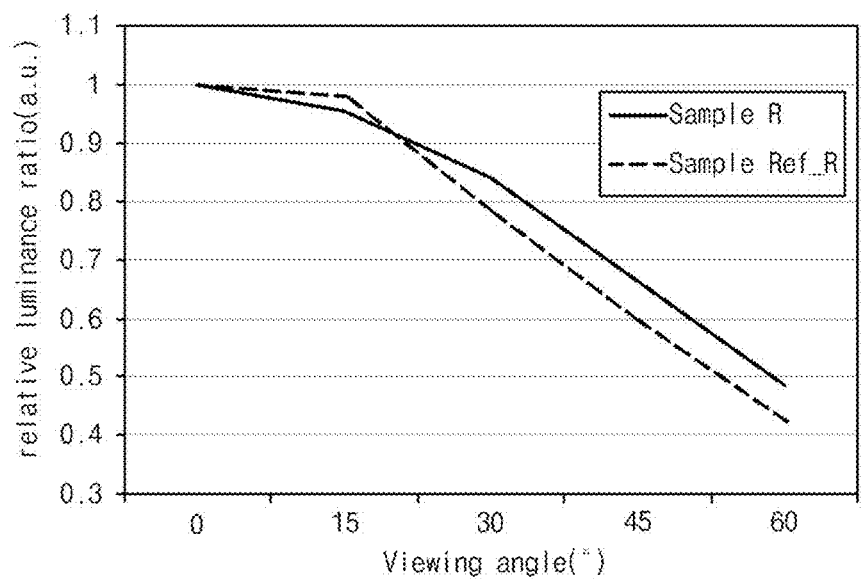
Figure 8D:
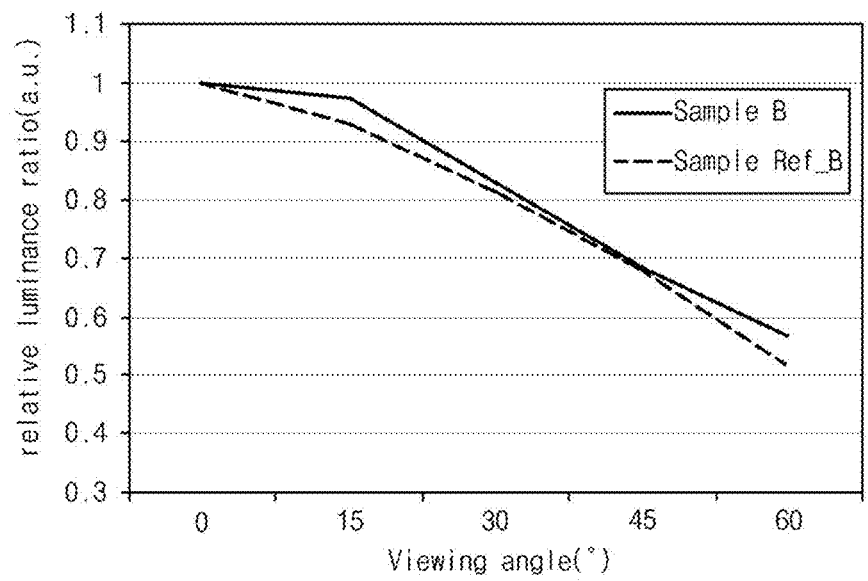

FIGS. 8A to 8D are graphs of measuring a luminance viewing angle according to presence or absence of the random nano-pattern 213 of the passivation layer 210. FIG. 8A is an experimental result of measuring a relative luminance ratio according to a viewing angle of a white light, FIG. 8B is an experimental result of measuring a relative luminance ratio according to a viewing angle of a green light, FIG. 8C is an experimental result of measuring a relative luminance ratio according to a viewing angle of a red light, and FIG. 8D is an experimental result of measuring a relative luminance ratio according to a viewing angle of a blue light.

In the graphs of FIGS. 8A to 8D, a horizontal axis indicates a viewing angle, and a vertical axis indicates a relative luminance ratio (a.u. (arbitrary unit)) to a front.

A following Table 1 is a result of summarizing FIGS. 8A to 8D.

TABLE 1

|  | W | R | G | B |
|---|---|---|---|---|
| Sample Ref_W/R/G/B | 55° | 53° | 50° | 63° |
| Sample W/R/G/B | 59° | 59° | 56° | 69° |
| Difference | +4° | +6° | +6° | +6° |

In FIGS. 8A to 8D and Table 1, Sample W, Sample R, Sample G and Sample B respectively represent a white light, a red light, a green light and a blue light emitted from the organic light emitting diode display (100 of FIG. 2) according to the embodiment of the present invention. Sample Ref_W, Sample Ref_R, Sample Ref_G and Sample Ref_B respectively represent a white light, a red light, a green light and blue light emitted from an organic light emitting diode display in which random nano-patterns are not provided in a passivation layer.

First, referring to W in FIG. 8A and Table 1, Sample Ref_W has a viewing angle of 55 degrees that is capable of implementing a luminance ratio of 0.5, whereas Sample W has a viewing angle of 59 degrees that is capable of implementing a luminance ratio of 0.5. It can be seen that the viewing angle of Sample W is increased by about 4 degrees compared to Sample Ref_W.

In addition, referring to G in FIG. 8B and Table 1, Sample Ref_G has a viewing angle of 50 degrees that is capable of implementing a luminance ratio of 0.5, whereas Sample G has a viewing angle of 56 degrees that is capable of implementing a luminance ratio of 0.5. It can be seen that the viewing angle of Sample G is increased by about 6 degrees compared to Sample Ref_G. In addition, referring to R in FIG. 8C and Table 1, Sample Ref_R has a viewing angle of 53 degrees that is capable of implementing a luminance ratio of 0.5, whereas Sample R has a viewing angle of 59 degrees that is capable of implementing a luminance ratio of 0.5. It can be seen that the viewing angle of Sample R is increased by about 6 degrees compared to Sample Ref_R.

In addition, referring to B in FIG. 8D and Table 1, Sample Ref_B has a viewing angle of 63 degrees that is capable of implementing a luminance ratio of 0.5, whereas Sample B has a viewing angle of 69 degrees that is capable of implementing a luminance ratio of 0.5. It can be seen that the viewing angle of Sample B is increased by about 6 degrees compared to Sample Ref_B.

As such, when the random nano-patterns 213 are provided at the passivation layer 210, a light, which may be extinguished due to a total reflection, among a light emitted from the organic light-emitting layer 113 is refracted and scattered in a direction in which it is output, thereby improving a viewing angle.

In this case, the passivation layer 210 may be made of an insulating material having a refractive index of about 1.4 to 1.5. For example, the passivation layer 210 may be made of one of an acrylic resin, an epoxy resin, a phenol resin, a polyamide-based resin, a polyimide-based resin, an unsaturated polyester-based resin, a polyphenylene-based resin, a polyphenylenesulfide-based resin, a benzocyclobutene and photoresist, but is not limited thereto, and may be formed of any insulating material having a refractive index of about 1.4 to 1.5.

In addition, the first overcoat layer 220 may be located on the passivation layer 210 including the random nano-patterns 213 and may include a plurality of concave portions 118 and a plurality convex portions 117, which are alternately disposed at the surface of the first overcoat layer 220 so that the surface of the first overcoat layer 220 forms the micro lenses ML. The second overcoat layer 230 may be positioned over the first overcoat layer 220 and cover the micro lenses ML of the first overcoat layer 220 to have a flat surface.

Here, as shown in FIG. 9, in the micro lenses ML of the first overcoat layer 220, the convex portion 117 may be divided into a bottom portion 117a, a top portion 117b, and a side surface portion 117c that connects the bottom portion 117a and the top portion 117b to form the entire inclined surface forming the top portion 117b.

At this time, a slope θ formed between a tangent C1 of the side surface portion 117c and a horizontal plane (i.e., the bottom portion 117a) may be 20 to 60 degrees. When the inclination θ is less than 20 degrees, a light propagation angle by the micro lens ML is not significantly different from that of the organic light emitting diode display in which the first overcoat layer 220 is flat, so there is little improvement in efficiency.

In addition, when the slope θ exceeds 60 degrees, the light propagation angle is formed to be greater than a total reflection angle between the substrate 101 and an air layer outside the substrate 101, and an amount of a light trapped inside the organic light emitting diode display is greatly increased. Thus, an efficiency is rather lower than that of the organic light emitting diode display in which the first overcoat layer 220 is flat.

As described above, as the slope θ formed between the tangent line C1 of the side surface portion 117c and the horizontal plane (i.e., the bottom portion 117a) is defined as 20 to 60 degrees, the concave portion 118 and the top portion 117b may be defined as regions in which the slope θ formed between the tangent line C1 and the horizontal plane (i.e., the bottom portion 117a) is less than 20 degrees, and the side surface portion 117c may be defined as a region in which the slope θ formed between the tangent line C1 and the horizontal plane (i.e., the bottom portion 117a) is 20 degrees or more.

In the convex portion 117 of the first overcoat layer 220, the top portion 117b may be formed in a pointed structure in order to further increase a light extraction efficiency of the organic light emitting layer 113. The convex portion 117 may have a triangular cross-sectional structure including a vertex corresponding to the top portion 117b, a base corresponding to the bottom portion 117a, and a hypotenuse corresponding to the side surface portion 117c.

As described above, in the organic light emitting diode display (100 of FIG. 2) according to the embodiment of the present invention, by forming the micro lenses ML in the first overcoat layer 220, a travelling path of a light that is not extracted to the outside due to repeated total reflections inside the organic light emitting diode display (100 of FIG. 2) is changed toward the substrate 101, and thus a light extraction efficiency can be improved.

Here, the random nano-patterns 213 provided at the surface of the passivation layer 210 are formed in a fine concave-convex shape, have different sizes and shapes, and are irregularly arranged, whereas the micro lenses ML are regularly formed (e.g., a pattern) in the first overcoat layer 220 in which the plurality of concave portions 118 and the plurality of convex portions 117 are alternately disposed at the surface of the first overcoat layer 220.

Accordingly, the random nano-patterns 213 serve to scatter a light, and the micro lens ML can prevent an occurrence of a rainbow mura while improving an outward light extraction efficiency.

At this time, in the embodiment of the present invention, it is characterized in that by forming the second overcoat layer 230, which is positioned below the anode 111, of a high refractive index material having a refractive index approximate (or similar) to a refractive index of the anode 111 so as to match the refractive index with the anode 111, a total reflection due to a difference in refractive index between the two media i.e., between the anode 111 and the second overcoat layer 230 can be prevented.

In other words, as the refractive index of the transparent anode 111 made of ITO is about 1.7 to 1.8, by applying a high refractive index material which improves the refractive index of the second overcoat layer 230 to 1.57 to 1.8, so as to match the refractive index with the anode 111, an occurrence of a total reflection at a boundary between the anode 111 and the second overcoat layer 230 is prevented. In the description, the term "approximate" used regarding the refractive indexes of the anode 111 and the second overcoat layer 230 may refer to values that are equal to or close to each other within a threshold difference. For example, a difference in refractive index between the anode 111 and the second overcoat layer 230 may be 0.13 or less.

As the second overcoat layer 230 is made of a high refractive index material as described above, the first overcoat layer 220 has a refractive index of 1.43 to 1.57 and a refractive index difference between the first overcoat layer 220 and the second overcoat layer 230 is at least 0.2.

Accordingly, when a light is emitted from the organic light emitting layer 113 positioned on the flat surface of the second overcoat layer 230, the light passes through the second overcoat layer 230 and is incident on the first overcoat layer 220. At this time, as the refractive index of the second overcoat layer 230 is higher than that of the first overcoat layer 220, at an incident angle of light which is greater than a critical angle of a total reflection, it is common that a light is not emitted to the outside but is absorbed into an element due to an internal total reflection phenomenon. However, in the organic light emitting diode display (100 in FIG. 2) according to the embodiment of the present disclosure, a travelling path of a light that is not extracted to the outside due to repeated total reflections inside the first and second overcoat layers 220 and 230 can be changed toward the substrate 101.

In other words, in the organic light emitting display device (100 in FIG. 2) according to the embodiment of the present disclosure, by providing the micro lenses ML at the surface of the first overcoat layer 220, a light, which is continuously totally reflected inside the organic light emitting diode display (100 in FIG. 2) and is trapped, among the light emitted from the organic light emitting layer 113 is extracted to the outside through multiple reflections while traveling at an angle smaller than the critical angle of the total reflection by the micro lens ML of the first overcoat layer 220.

Accordingly, since an outward emission efficiency is increased, a light extraction efficiency of the organic light emitting diode display (100 in FIG. 2) can be improved.

In particular, since a difference in refractive index between the second overcoat layer 230 and the first overcoat layer 220 is 0.2 or more, a light extraction efficiency can be further improved.

FIG. 10 is a simulation result of measuring an efficiency improvement rate due to a difference in refractive index of first and second overcoat layers 220 and 230, and Table 2 is an experimental result of measuring an emission efficiency according to a difference in refractive index of first and second overcoat layers 220 and 230.

TABLE 2

|  | Sample 1 | Sample 2 | Sample 3 | Sample 4 |
| --- | --- | --- | --- | --- |
| $2^{nd}$ overcoat layer | 1.67 | 1.67 | 1.67 | 1.67 |
| $1^{st}$ overcoat layer | 1.57 | 1.45 | 1.43 | 1.40 |
| Emission efficiency (%) | 3% ↑ | 12% ↑ | 16% ↑ | 20% ↑ |

In FIG. 10 and Table 2, Sample 1 has a difference in refractive index of the first and second overcoat layers 220 and 230 of 0.1, Sample 2 has a difference in refractive index between the first and second overcoat layers 220 and 230 of 0.23, and Sample 3 has a refractive index difference the first and second overcoat layers 220 and 230 of 0.24, and Sample 4 has a difference in refractive index between the first and second overcoat layers 220 and 230 of 0.27.

Referring to FIG. 10 and Table 2, it is seen that when the difference in refractive index between the first and second overcoat layers 220 and 230 is 0.2 or less, a degree of improvement in emission efficiency is insignificant. This is because a light condensing effect hardly occurs substantially while a light passing through the second overcoat layer 230 passes through the first overcoat layer 220.

On the other hand, it is seen that when the difference in refractive index between the first and second overcoat layers 220 and 230 is 0.2 or more, an emission efficiency is improved by 12% or more due to a light condensing effect.

Here, when an emission efficiency is improved by about 12% or more, an increase in cost and a decrease in yield for forming the first and second overcoat layers 220 and 230 can be offset. Thus, in order to increase an emission efficiency by about 12% or more, it is preferable to design the difference in refractive index between the first and second overcoat layers 220 and 230 to be 0.2 or more.

In addition, the first overcoat layer 220 is preferably formed approximately (or similarly) in refractive index to the passivation layer 210 positioned below the first overcoat layer 220 so as to match the refractive index. In other words, it is preferable to prevent a total reflection due to a difference in refractive index between the first overcoat layer 220 and the passivation layer 210. In the description, the term "approximate" used regarding the refractive indexes of the first overcoat layer 220 and the passivation layer 210 may refer to values that are equal to or close to each other within a threshold difference. For example, a difference in refractive index between the first overcoat layer 220 and the passivation layer 210 may be 0.07 or less.

Here, referring back to FIG. 4A, in the case of the white sub-pixel W-SP in which a separate wavelength conversion layer (108r, 108g or 108b of FIG. 2) is not provided, in a process in which a light L that passes through the first overcoat layer 220 is incident on the passivation layer 210, an internal total reflection at an interface due to a difference in refractive index between the first overcoat layer 220 and the passivation layer 210 can be prevented from occurring.

Accordingly, all of the light L passing through the first overcoat layer 220 can be incident on the passivation layer 210.

In more detail, the passivation layer 210 and the first overcoat layer 220 may have a refractive index of 1.43 to 1.57, and the second overcoat layer 230 may have a refractive index of 1.57 to 1.8. In this case, a difference in refractive index between the first overcoat layer 220 and the second overcoat layer 230 may be about 0.2 or more.

Accordingly, when the light L is emitted from the organic light emitting layer 113 positioned on the flat surface of the second overcoat layer 230, the light L passes through the second overcoat layer 230 and then is incident on the first overcoat layer 220. In this case, the organic light emitting diode display 100 according to the embodiment of the present disclosure (100 in FIG. 2) includes the micro lenses ML at the surface of the first overcoat layer 220, so that the travelling path of the light L, which is not extracted to the outside by repeated total reflections inside the first and second overcoat layers 220 and 230 can be changed toward the substrate 101.

At this time, the light L traveling from the second overcoat layer 230 to the first overcoat layer 220 is condensed.

The light L that passes through the first overcoat layer 220 is incident on the passivation layer 210 having an approximate (or similar) refractive index as it is. At this time, as the random nano-patterns 213 are provided at the surface of the passivation layer 210, the light L is refracted and scattered in an output direction.

In addition, as shown in FIG. 6B, when the wavelength conversion layer 108g is positioned above the passivation layer 210, the wavelength conversion layer 108g may have a refractive index of about 1.6 to 1.8. Accordingly, when the light L, which is condensed by passing through the first and second overcoat layers 220 and 230, is incident on the wavelength conversion layer 108g, the light L is incident from a low medium to a high medium. Thus, according to Snell's law, the light L is refracted and propagated at a larger angle based on the normal line at the incident point of the light L.

In other words, the light L incident from the first overcoat layer 220 to the wavelength conversion layer 108g is condensed.

Even though the light L incident from the wavelength conversion layer 108g to the passivation layer 210 is also incident from a high medium to a low medium, an internal total reflection is not caused by the random nano-patterns 213 provided at the surface of the passivation layer 210, and the travelling path is changed toward the substrate 101.

In particular, because of the random nano-patterns 213, the light L incident from the wavelength conversion layer 108g to the passivation layer 210 is refracted in an output direction while the travelling path of the light L is changed.

Therefore, in the red, green and blue sub-pixels (R-SP, G-SP and B-SP of FIG. 2) provided with the wavelength conversion layers (108r, 108g and 108b of FIG. 2), the light L is further condensed from the first overcoat layer 220 to the wavelength conversion layers (108r, 108g and 108b of FIG. 2) and from the wavelength conversion layers (108r, 108g and 108b of FIG. 2) to the passivation layer 210, an extraction efficiency of the light L is further improved.

In summary, in the organic light emitting diode display (100 of FIG. 2) according to the embodiment of the present disclosure, even if the wavelength conversion layers (108r, 108g and 108b of FIG. 2) is provided or not, the travelling path of the light L, which is emitted from the organic light emitting layer 113 and is not extracted to the outside due to an internal total reflection by the first overcoat layer 220 including the micro lens ML and the second overcoat layer 230, is changed toward the substrate 101, an extraction efficiency of the light L is improved.

In addition, by forming the random nano-patterns 213 at the surface of the passivation layer 210, the light L is refracted and scattered in an output direction, so that a light extraction area OP is formed to be wider than that of the emission area EA.

In other words, in the organic light emitting diode display 100 according to the embodiment of the present disclosure, the light emitted from the organic light emitting layer 113 of the emission area EA is condensed, refracted, and scattered while passing through the first and second overcoat layers 220 and 230 and the passivation layer 210. Thus, a light is output (or exit) from all areas except for the switching area TrA, in which the electrodes of the non-emission area NEA are formed, and areas covered by signal lines.

Accordingly, since the light extraction area OP is formed wider than the emission area EA, a luminance viewing angle is improved. Through this, an aperture ratio is improved, and thus a high luminance can also be realized.

In particular, in the case of the red, green and blue sub-pixels (R-SP, G-SP and B-SP of FIG. 2) further provided with the wavelength conversion layers (108r, 108g and 108b of FIG. 2), the refractive index relationship of the first overcoat layer 220 and the passivation layer 210, which are positioned on and below the wavelength conversion layers (108r, 108g and 108b in FIG. 2), allows the light L to be more condensed. Therefore, it is possible to further improve the light (L) extraction efficiency.

The light L can be further condensed by a refractive index relationship between the wavelength conversion layers (108r, 108g and 108b in FIG. 2), and the first overcoat layer 220 and the passivation layer 210 which are positioned on and below the wavelength conversion layers (108r, 108g and 108b in FIG. 2). Thus, the extraction efficiency of the light L can be further improved.

Therefore, in the above description, it is described as an example that a separate wavelength conversion layer is not located in the white sub-pixel W-SP. However, a wavelength conversion layer (not shown) may be positioned even in the white sub-pixel W-SP to further improve the extraction efficiency of the light L. In other words, a white color filter may be further disposed in the white sub-pixel W-SP.

In this case, the first and second overcoat layers 220 and 230 may be made of an insulating material having a refractive index of about 1.4 to 1.8. For example, the first and second overcoat layers 220 and 230 may be made of one of an acrylic resin, an epoxy resin, a phenol resin, a polyamide-based resin, a polyimide-based resin, an unsaturated polyester-based resin, a polyphenylene-based resin, a polyphenylenesulfide-based resin, a benzocyclobutene and a photoresist, but not limited to, and may be made of any insulating material having a refractive index of about 1.4 to 1.8.

As described above, in the organic light emitting diode display (100 of FIG. 2) according to the embodiment of the present disclosure, by providing the random nano-patterns 213 at the surface of the passivation layer 210, the luminance viewing angle is improved. Accordingly, the aperture ratio is improved, and thus a high luminance can also be realized.

In addition, in the organic light emitting diode display (100 of FIG. 2) according to the embodiment of the present disclosure, the first and second overcoat layers 220 and 230 having different refractive indices are stacked on each other, and the first overcoat layer 220 includes the micro lenses ML, and the second overcoat layer 230 covers the micro lenses ML to be planarized, thereby improving the extraction efficiency of the light L and preventing the occurrence of a rainbow mura.

In addition, by preventing an occurrence of a high reflectance, it is possible to prevent deterioration of a visibility of a black color, thereby improving a contrast ratio.

In particular, the passivation layer 210 and the first overcoat layer 220 have an approximate (or similar) refractive index, the second overcoat layer 230 has an approximate (or similar) refractive index to the anode 111, and a refractive index difference between the first overcoat layer 220 and the second overcoat layer 230 preferably is about 0.2 or more. Accordingly, the extraction efficiency of the light L can be further improved.

In addition, the organic light emitting layer 113 of a uniform thickness can be formed for each sub-pixel (R-SP, W-SP, G-SP, and B-SP in FIG. 2), so that each sub-pixel (R-SP, W-SP, G-SP, and B-SP in FIG. 2) can have a uniform light emitting characteristic, thereby improving the efficiency of the organic light emitting layer 113 and also increasing the lifespan.

As the organic light emitting layer 113 is formed to have a uniform thickness for each of the sub-pixels R-SP, W-SP, G-SP and B-SP, an emission characteristic can be also uniform for each of the sub-pixels R-SP, W-SP, G-SP and B-SP, and through this, an efficiency of the organic light emitting layer 113 is increased and a lifetime can also be improved.

Figure 11:
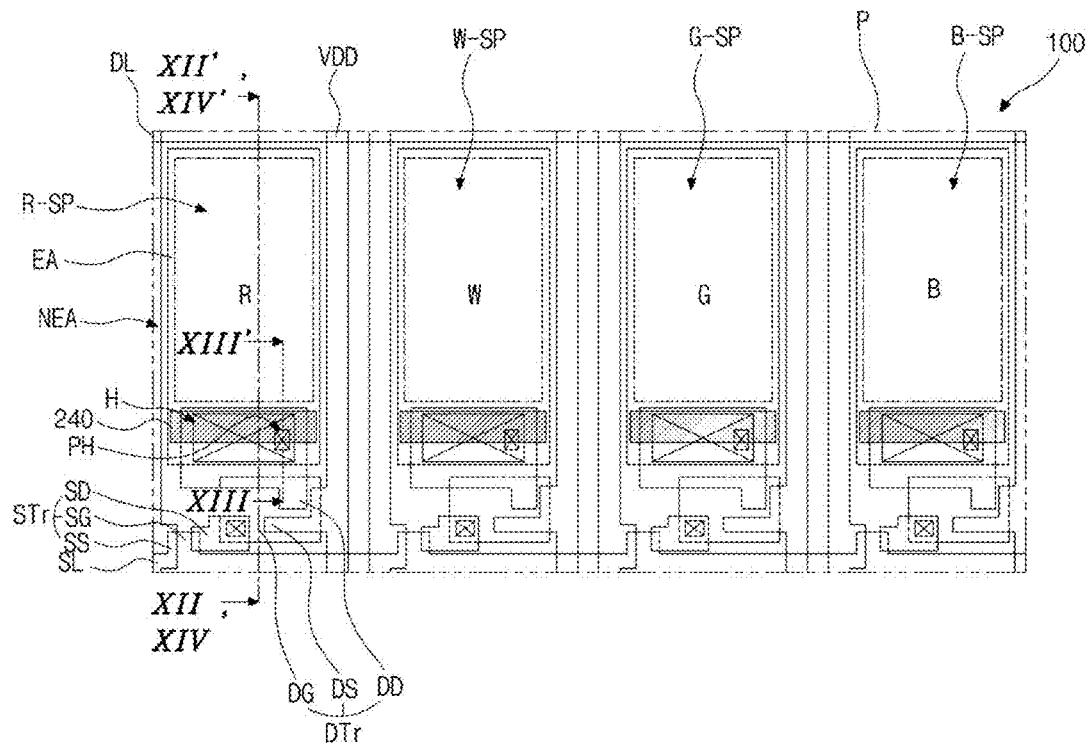
FIG. 11 is a plan view illustrating a structure of a unit pixel including four sub-pixels in an organic light emitting diode display according to another embodiment of the present disclosure.

FIG. 11 is a plan view illustrating a structure of a unit pixel including four sub-pixels in an organic light emitting diode display according to another embodiment of the present disclosure.

Figure 12:
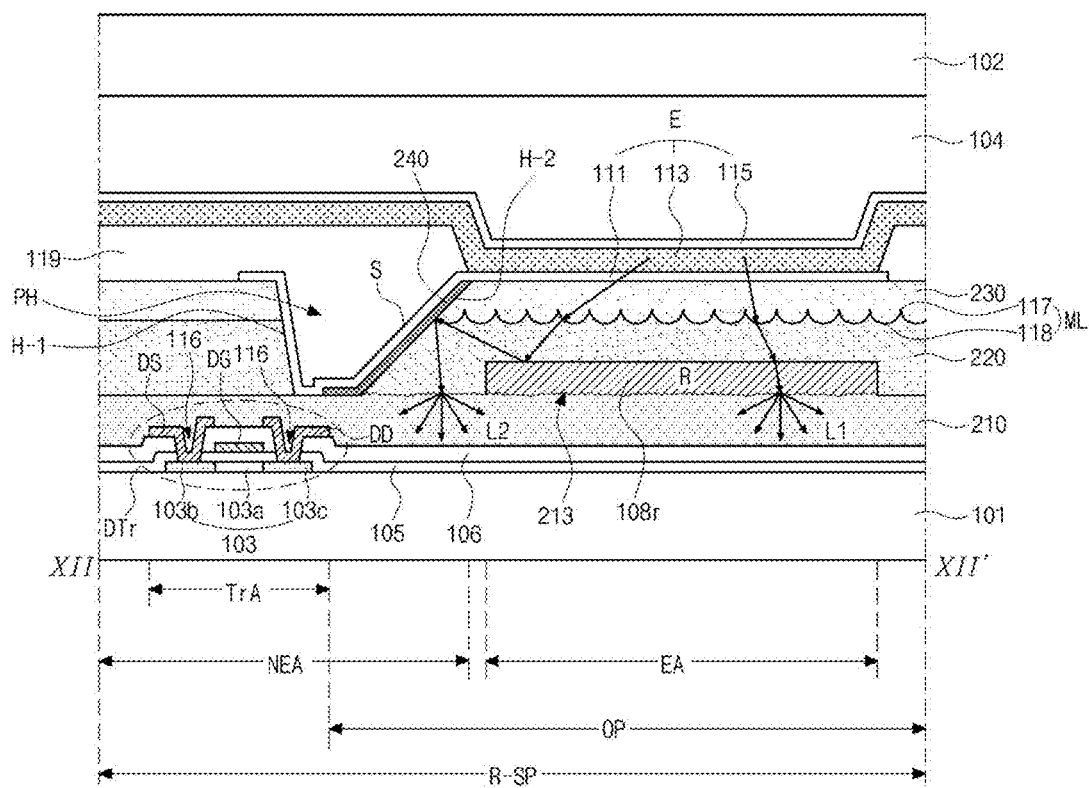
FIG. 12 is a cross-sectional view, taken along a line XII-XII' in FIG. 11, illustrating one sub-pixel of an organic light emitting diode display according to another embodiment of the present disclosure.
Figure 13:
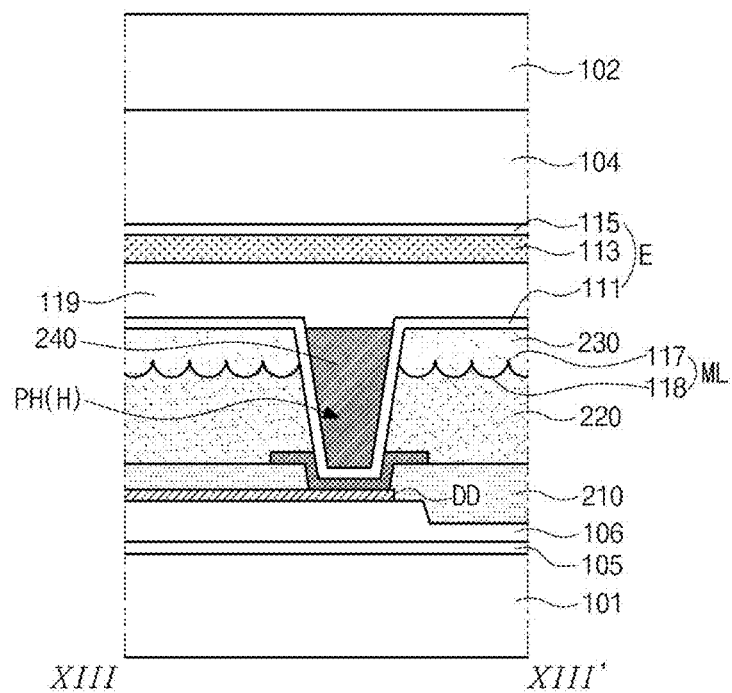
FIG. 13 is a cross-sectional view taken along a line XIII-XIII' in FIG. 11 according to another embodiment of the present disclosure.
Figure 14:
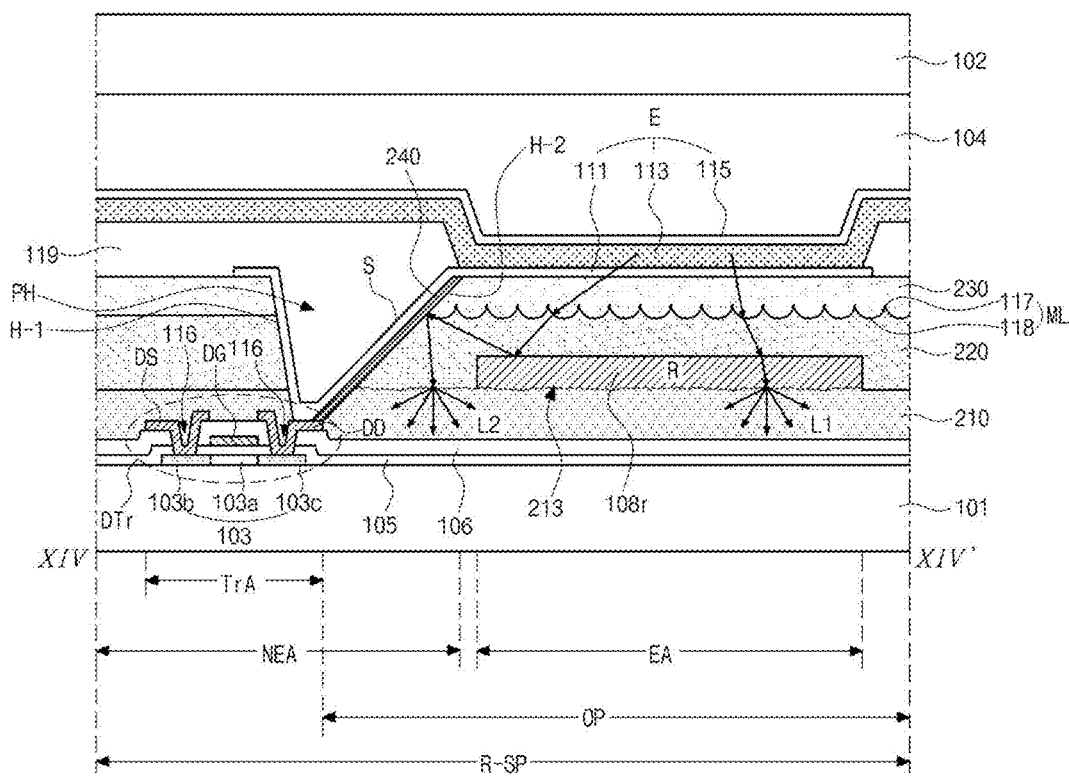
FIG. 14 is a cross-sectional view, taken along a line XIV-XIV' in FIG. 11, of one sub-pixel of an organic light emitting diode display according to another embodiment of the present disclosure.

FIG. 12 is a cross-sectional view, taken along a line XII-XII' in FIG. 11, illustrating one sub-pixel of an organic light emitting diode display according to another embodiment of the present disclosure. FIG. 13 is a cross-sectional view taken along a line XIII-XIII' in FIG. 11. FIG. 14 is a cross-sectional view, taken along a line XIV-XIV' in FIG. 11, of one sub-pixel of the organic light emitting diode display according to another embodiment of the present disclosure. Here, in order to avoid repeated explanations, the same reference numerals are assigned to the same parts that play the same roles as those of the above-described embodiment, and the characteristic contents to be described in this embodiment may be described.

As shown in FIG. 11, a plurality of sub-pixels R-SP, W-SP, G-SP and B-SP may be defined on a substrate 101, and each of the sub-pixels R-SP, W-SP, G-SP and B-SP may be defined by an intersecting structure of gate lines SL, data lines DL and power lines VDD, but is not limited thereto.

A switching thin film transistor STr located in a switching area TrA may be formed at the intersection of the gate line SL and the data line DL. The switching thin film transistor STr may include a gate electrode SG branching from the gate line SL, a semiconductor layer (not shown), a source electrode SS, and a drain electrode SD.

A driving thin film transistor DTr may include a gate electrode DG connected to the drain electrode SD of the switching thin film transistor STr, a semiconductor layer 103, a source electrode DS connected to the power line VDD, and a drain electrode DD.

The drain electrode DD of the driving thin film transistor DTr may be connected to an anode 111 of a light emitting diode E through a drain contact hole PH, and an organic light emitting layer 113 may be interposed between the anode 111 and a cathode 115.

Here, the organic light emitting diode display 100 according to the embodiment of the present invention may further include a groove H exposing a passivation layer 210 corresponding to a boundary between an emission area EA and a non-emission area NEA provided with the switching area TrA, and a drain contact hole PH exposing the drain electrode DD may be provided in the groove H.

In addition, a reflective layer 240 may be further formed in a portion of the groove H adjacent to the emission area EA.

In more detail, referring to FIGS. 12 to 13, the driving thin film transistor DTr may be positioned on the switching region TrA of the non-emission region NEA of each of the sub-pixel W-SP, R-SP, G-SP and B-SP on the substrate 101. The thin film transistor DTr may include the semiconductor layer 103 including source and drain regions 103*b* and 103*c*, a gate insulating layer 105 and the gate electrode DG positioned on the semiconductor layer 103, and source and drain electrodes DS and DD.

In addition, the passivation layer 210 may be positioned on the source and drain electrodes DS and DD and the inter-layered insulating layer 106 exposed between the two electrodes DS and DD.

It is characterized in that the passivation layer 210*a* includes random nano-patterns 213 at the surface thereof.

The random nano-patterns 213 may have a fine concavo-convex shape and may each be different in size and form and have an irregular arrangement. The random nano-pattern 213 may be formed to have a size and a pitch of a wavelength band of visible light or less.

Wavelength conversion layers 108*r*, 108*g* and 108*b* may be positioned on the passivation layer 210 to correspond to the emission areas EA of the respective sub-pixels R-SP, G-SP and B-SP. The wavelength conversion layers 108*r*, 108*g* and 108*b* may include color filters transmitting only wavelengths of color lights set in the red, green and blue sub-pixels R-SP, G-SP and B-SP among white lights emitted from the light emitting diodes E toward the substrate 101.

In this case, a white color filter may be located in the white sub-pixel W-SP, or a white light emitted from the organic light emitting layer 113 may be transmitted as it is without a white color filter.

A first overcoat layer 220 including a surface forming micro lenses ML may be positioned on the passivation layer 210 including the wavelength conversion layers 108*r*, 108*g* and 108*b*. The micro lenses ML may have a plurality of concave portions 118 and a plurality of convex portions 117 alternately arranged. The convex portions 117 may have a structure that defines or surrounds each concave portion 118. The convex portion 117 may include a bottom portion (117*a* of FIG. 9), a top portion (117*b* of FIG. 9) and a side surface portion (117*c* of FIG. 9).

Here, a size of the random nano-pattern 213 provided at the surface of the passivation layer 210 may be smaller than that of the micro lens ML, and may be formed more finely than a micrometer (um).

In other words, when the micro lens ML may have a size of several micrometers, the size of the random nano-pattern 213 may be several nanometers. Accordingly, a light emitted from the organic light emitting layer 113 is scattered without loss by the random nano-pattern 213, thereby improving a luminance viewing angle.

In addition, the random nano-patterns 213 provided at the surface of the passivation layer 210 are formed in a fine concave-convex shape, have different sizes and shapes, and are irregularly arranged, whereas the micro lenses ML are regularly formed in the first overcoat layer 220 in which the plurality of concave portions 118 and the plurality of convex portions 117 are alternately disposed at the surface of the first overcoat layer 220.

Accordingly, the random nano-patterns 213 serve to scatter a light, and the micro lens ML can prevent an occurrence of a rainbow mura while improving an outward light extraction efficiency.

As shown in FIGS. 12 and 13, on the first overcoat layer 220 including the micro lenses ML, the second overcoat layer 230 along with the first overcoat layer 220 having the groove H exposing the passivation layer 210 positioned there below may be positioned.

In addition, as shown in FIG. 14, the drain contact hole PH exposing the drain electrode DD may be formed in the groove H. The drain contact hole PH may be formed in the first and second overcoat layers 220 and 230 and the passivation layer 210. The second overcoat layer 230 may cover the micro lenses ML of the first overcoat layer 220 to have a flat surface.

The second overcoat layer 230 and the first overcoat layer 220 may have different refractive indices. In one embodiment, the refractive index of the second overcoat layer 230 is greater than that of the first overcoat layer 220. In other words, the passivation layer 210 and the first overcoat layer 220 may have a refractive index of 1.4 to 1.5, the second overcoat layer 230 may have a refractive index of 1.6 to 1.8, and a difference in refractive index between the first overcoat layer 220 and the second overcoat layer 230 is about 0.2 or more.

The anode 111 of the light emitting diode E made of, for example, a material having a relatively high work function value may be disposed on the second overcoat layer 230 with the flat surface and be connected to the drain electrode DD of the driving thin film transistor DTr. A bank 119 may be positioned between the anodes 111 positioned in the respective sub-pixels R-SP, W-SP, G-SP and B-SP.

The organic light emitting layer 113 and the cathode 115 may be sequentially positioned on the anode 111. All of the anode 111, the organic light emitting layer 113 and the cathode 115 sequentially positioned on the second overcoat layer 230 may be formed to be flat along the flat surface of the second overcoat layer 230.

Here, the organic light emitting diode display 100 according to the embodiment of the present invention is characterized in that a portion of the groove H and the drain contact hole PH adjacent to the emission area EA may form an inclined surface S.

In other words, among side surfaces forming the groove H and the drain contact hole PH, at least a portion of the side surface positioned adjacent to the emission area EA may include the inclined surface S inclined toward the emission area EA.

The inclined surface S of the groove H and the drain contact hole PH may be formed to extend from one end of the switching area TrA to one end of the emission area EA, and a reflective layer 240 may be provided on the inclined surface S of the groove H and the drain contact hole PH.

Accordingly, the groove H and the drain contact hole PH may be formed such that a slope of one edge H-1 (e.g., a first edge) toward the switching area TrA is larger than that of the other edge H-2 (e.g., a second edge) toward the emission area EA with respect to a horizontal plane. Accordingly, the one edge H-1 toward the switching area TrA and the other edge H-2 toward the emission area EA may be asymmetric to each other.

The reflective layer 240 on the inclined surface S provided at the other edge H-2 of the groove H and the drain contact hole PH toward the emission area EA may be made of any material capable of reflecting light, and may include a metal material having an excellent reflectance. For example, the reflective layer 240 may include at least one of molybdenum (Mo), an alloy of molybdenum and titanium (MoTi), aluminum (Al), silver (Ag), APC (Ag;Pb;Cu) and platinum (Pt).

The reflective layer 240 formed on the inclined surface S of the groove H and the drain contact hole PH may serve to extract a light L2 travelling to the non-emission area NEA to the outside.

In more detail, the organic light emitting layer 113 that directly generates the lights L1 and L2 therein radiates the light L1 and L2 radially. The first light L1, which is a part of the lights L1 and L2 emitted from the organic light emitting layer 113, passes through the anode 111 and is incident on the second overcoat layer 230. The first light L1 passing through the second overcoat layer 230 has its travelling path changed toward the substrate 101 through the micro lens ML provided in the first overcoat layer 220, and passes through the first and second overcoat layers 220 and 230 to be condensed.

The first light L1 is condensed again when passing through the wavelength conversion layer 108r, and then is incident on the passivation layer 210. The first light L1 is incident on the passivation layer 210 from the wavelength conversion layer 108r. The first light L1 incident from the wavelength conversion layer 108r to the passivation layer 210 is refracted and scattered in an output direction while the travelling path of the first light L1 is changed by the random nano-patterns 213.

Accordingly, in the organic light emitting diode display 100 according to the embodiment of the present disclosure, a light extraction efficiency is improved, and the light extraction area OP is formed to be wider than that of the emission area EA.

Accordingly, a luminance viewing angle is improved, thus an aperture ratio is improved, and thus a high luminance can also be realized.

In addition, by making the second overcoat layer 230 cover the micro lens ML to be planarized, it is possible to prevent an occurrence of a rainbow mura. Furthermore, by preventing an occurrence of a high reflectance, it is possible to prevent a decrease in a visibility of a black color, thereby improving a contrast ratio.

Meanwhile, in the organic light emitting diode display 100 according to the embodiment of the present disclosure, since the second light L2, which is a part of the radially emitted lights, has an angle greater than a critical angle of a total reflection, the second light L2 does not pass through the substrate 101, but is totally reflected at a boundary of the substrate 101 and proceeds to the non-emission area NEA.

The second light L2 travelling to the non-emission area NEA may be trapped inside the organic light emitting diode display 100. However, in the organic light emitting diode display 100 according to the embodiment of the present disclosure, the second light L2 trapped inside the non-emission area NEA is reflected by the reflective layer 240 to be extracted outside the substrate 101.

Accordingly, in the organic light emitting diode display 100 according to the embodiment of the present disclosure, a light extraction efficiency is further improved.

In particular, since the second light L2 reflected by the reflective layer 240 and extracted outside the substrate 101 is output from the non-emission area NEA to the outside, the non-emission area NEA, in which the reflection layer 240 is formed, also forms the light extraction area OP.

In other words, the light extraction area OP may be defined to include both the non-emission area NEA, in which the reflective layer 240 of the groove H and the drain contact hole PH is located, and the light emitting area EA.

Accordingly, the organic light emitting diode display 100 according to the embodiment of the present disclosure can have the wide light extraction area OP even though the emission area EA is narrowed by a design area of the thin film transistor DTr and the like, so that an aperture ration can be further improved and a higher luminance can be realized.

In summary, in the organic light emitting diode display 100 according to the embodiment of the present disclosure, by providing the random nano-patterns 213 at the surface of the passivation layer 210, the light extraction area OP can be widened, thereby improving a luminance viewing angle and improving an aperture ratio.

In addition, the first and second overcoat layers 220 and 230 having different refractive indices are positioned to be stacked on each other, the first overcoat layer 220 includes the micro lenses ML, and the second overcoat layer 230 covers the micro lenses ML to be planarized. Thus, the extraction efficiency of light L can be improved, and a rainbow mura can be prevented from occurring.

In addition, by preventing an occurrence of a high reflectance, it is possible to prevent deterioration of a visibility of a black color. Thus, a contrast ratio can be improved. In addition, the passivation layer 210 and the first overcoat layer 220 have an approximate (or similar) refractive index, the second overcoat layer 230 has an approximate (or similar) refractive index to the anode 111, and a refractive index difference between the first overcoat layer 220 and the second overcoat layer 230 preferably is about 0.2 or more, so that a light extraction efficiency can be further improved.

In particular, the second light L2 proceeding to the non-emission area NEA is also reflected through the reflective layer 240 provided on the inclined surface S of the groove H and the drain contact hole PH, and is extracted to the outside of the substrate 101. Accordingly, a light extraction efficiency of the organic light emitting diode display 100 according to the embodiment of the present invention is further improved.

In the organic light emitting diode display 100, the bank 119 positioned between the anodes 111 positioned for the respective sub-pixels R-SP, W-SP, G-SP and B-SP may be positioned to cover both the groove H and the drain contact hole PH. After placing a protective film 102 in a form of a thin film on the driving thin film transistor DTr and the light emitting diode E, a face seal 104, which is made of an organic or inorganic insulating material that is transparent and has an adhesive property, is interposed between the light emitting diode E and the protective film 102, and the protective film 102 and the substrate 101 are bonded to each other through the face seal 104, thereby encapsulating the organic light emitting diode display 100.

In one embodiment, a first portion of the random nano-patterns 213 overlaps the reflective layer 240 in the non-emission area NEA and a second portion of the random nano-patterns 213 overlaps the emission area EA. Thus, by forming the random nano-patterns 213 located at the surface of the passivation layer 210 to correspond (e.g., overlap) to the non-emission area NEA in which the reflective layer 240 is provided, a light travelling to the non-emission area NEA is allowed to be refracted and scattered without loss and thus a light extraction efficiency is further improved.

At this time, by forming the random nano-patterns 213 to correspond to the non-emission area NEA, even if the random nano-pattern 213 are located adjacent to the neighboring sub-pixels R-SP, W-SP, G-SP and B-SP, the light refracted and scattered by the random nano-patterns 213 is not incident on the adjacent sub-pixels R-SP, W-SP, G-SP and B-SP by the reflective layer 240. Therefore, there is no problem in that a color reproducibility is reduced due to a color mixing occurring in the adjacent sub-pixels R-SP, W-SP, G-SP and B-SP.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display comprising:
   a substrate including a plurality of sub-pixels, each of the plurality of sub-pixels including an emission area that emits light and a non-emission area;
   a thin film transistor in the non-emission area of a sub-pixel;
   a passivation layer on the thin film transistor, the passivation layer including a surface that has random nano-patterns;
   a first overcoat layer on the passivation layer, the first overcoat layer including a surface having a plurality of micro lenses and the first overcoat layer having a first refractive index;
   a second overcoat layer on the first overcoat layer, the second overcoat layer including a flat surface and a second refractive index that is greater than the first refractive index of the first overcoat layer; and
   a light emitting diode on the second overcoat layer in the emission area of the sub-pixel,
   wherein the random nano-patterns have an irregularly arranged concave-convex shape, and a size and a pitch that corresponds to a wavelength band of visible light.

2. The organic light emitting diode display of claim 1, wherein a size of the random nano-patterns is less than a size of the plurality of micro lenses.

3. The organic light emitting diode display of claim 2, wherein the size of the random nano-pattern is a plurality of nanometers, and the size of the plurality of micro lenses is a plurality of micrometers.

4. The organic light emitting diode display of claim 1, wherein the random nano-patterns are arranged irregularly, and the plurality of micro lenses have a concave portion and a convex portion that are alternately arranged.

5. The organic light emitting diode display of claim 1, wherein the first refractive index is in a range of 1.43 to 1.57, and the second refractive index is in a range of 1.57 to 1.8.

6. The organic light emitting diode display of claim 1, wherein a difference between the first refractive index and the second refractive index is at least 0.2.

7. The organic light emitting diode display of claim 1, wherein the light emitting diode includes an anode having a refractive index in a range of 1.7 to 1.8, and the refractive index of the anode matches the second refractive index.

8. The organic light emitting diode display of claim 1, wherein the passivation layer has a refractive index in a range of 1.4 to 1.5, and the refractive index of the passivation layer matches the first refractive index.

9. The organic light emitting diode display of claim 1, wherein the random nano-patterns overlap the emission area.

10. The organic light emitting diode display of claim 1, further comprising:
    a wavelength conversion layer between the random nano-patterns and the plurality of micro lenses.

11. The organic light emitting diode display of claim 1, wherein a light extraction area in which a light emitted from the light emitting diode is output from the light extraction area is wider than the emission area.

12. The organic light emitting diode display of claim 1, wherein the random nano-patterns overlap the emission area, and the plurality of micro lenses overlap the sub-pixel in the emission area.

13. The organic light emitting diode display of claim 1, wherein the first overcoat layer and the second overcoat layer include a groove that exposes a portion of the passivation layer, the groove located at a boundary between the emission area and a portion of the non-emission area that includes a switching area in which the thin film transistor is located,
    wherein the passivation layer, the first overcoat layer, and second overcoat layer include a drain contact hole in the groove that exposes a drain electrode of the thin film transistor,
    wherein the groove and the drain contact hole include an inclined surface that is inclined from the non-emission area toward the emission area, and the organic light emitting diode display further comprising:
a reflective layer on the inclined surface.

14. The organic light emitting diode display of claim 13, wherein a first edge of the groove extending toward the switching area and a second edge of the groove extending toward the emission area are asymmetric to each other.

15. The organic light emitting diode display of claim 14, wherein a slope of the first edge of the groove is greater than a slope of the second edge of the groove.

16. The organic light emitting diode display of claim 13, wherein a first portion of the random nano-patterns overlaps the reflective layer in the non-emission area and a second portion of the random nano-patterns overlaps the emission area.

17. The organic light emitting diode display of claim 13, wherein a light extraction area in which a light emitted from the light emitting diode is output from the light extraction area includes the emission area and the non-emission area.

18. The organic light emitting diode display of claim 1, wherein the light emitting diode includes:
an anode on the second overcoat layer, the anode connected to the thin film transistor;
an organic light emitting layer on the anode; and
a cathode on the organic light emitting layer.

19. An organic light emitting diode display comprising:
a substrate including a subpixel, the subpixel including an emission area that emits light and a non-emission area;
a thin film transistor in the non-emission area;
a passivation layer on the thin film transistor, a portion of a surface of the passivation layer that overlaps the emission area including a plurality of first protrusions where a first protrusion from the plurality of first protrusions has a first size;
an overcoat layer on the passivation layer, a surface of the overcoat layer including a plurality of second protrusions where a second protrusion from the plurality of second protrusions has a second size that is larger than the first size; and
a light emitting diode on the overcoat layer in the emission area, the light emitting diode connected to the thin film transistor,
wherein the plurality of first protrusions include a plurality of randomly dispersed protrusions, and the plurality of second protrusions include a plurality of lenses, and
wherein the plurality of randomly dispersed protrusions are a plurality of irregularly arranged concave-convex shapes having a size and a pitch that corresponds to a wavelength band of visible light.

20. The organic light emitting diode display of claim 19, wherein the first size of the first protrusion is a plurality of nanometers and the second size of a lens from the plurality of lenses is a plurality of micrometers.

21. The organic light emitting diode display of claim 19, wherein the plurality of first protrusions overlaps the plurality of second protrusions in the emission area.

22. The organic light emitting diode display of claim 19, further comprising:
another overcoat layer on the overcoat layer, the other overcoat layer having an index of refraction that is greater from an index of refraction of the overcoat layer,
wherein the other overcoat layer is between the light emitting diode and the overcoat layer.

23. An organic light emitting diode display comprising:
a substrate including a plurality of sub-pixels, each of the plurality of sub-pixels including an emission area that emits light and a non-emission area;
a thin film transistor in the non-emission area of a sub-pixel;
a passivation layer on the thin film transistor, the passivation layer including a surface that has random nano-patterns;
a first overcoat layer on the passivation layer, the first overcoat layer including a surface having a plurality of micro lenses and the first overcoat layer having a first refractive index;
a second overcoat layer on the first overcoat layer, the second overcoat layer including a flat surface and a second refractive index that is greater than the first refractive index of the first overcoat layer;
a reflective layer; and
a light emitting diode on the second overcoat layer in the emission area of the sub-pixel,
wherein the first overcoat layer and the second overcoat layer include a groove that exposes a portion of the passivation layer, the groove located at a boundary between the emission area and a portion of the non-emission area that includes a switching area in which the thin film transistor is located,
wherein the passivation layer, the first overcoat layer, and second overcoat layer include a drain contact hole in the groove that exposes a drain electrode of the thin film transistor,
wherein the groove and the drain contact hole include an inclined surface that is inclined from the non-emission area toward the emission area, and
wherein the reflective layer is on the inclined surface.

* * * * *